(12) United States Patent
Yeon et al.

(10) Patent No.: US 12,159,895 B2
(45) Date of Patent: Dec. 3, 2024

(54) LED DISPLAY APPARATUS

(71) Applicant: SAMSUNG ELECTRONICS CO., LTD., Suwon-si (KR)

(72) Inventors: Jihye Yeon, Hwaseong-si (KR); Sammook Kang, Hwaseong-si (KR); Hankyu Seong, Seoul (KR); Jongin Yang, Hwaseong-si (KR); Hanul Yoo, Yongin-si (KR); Jihoon Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 81 days.

(21) Appl. No.: 17/374,568

(22) Filed: Jul. 13, 2021

(65) Prior Publication Data

US 2022/0139999 A1    May 5, 2022

(30) Foreign Application Priority Data

Oct. 29, 2020    (KR) .................. 10-2020-0142487

(51) Int. Cl.
| | |
|---|---|
| *H01L 27/15* | (2006.01) |
| *G09G 3/32* | (2016.01) |
| *H01L 33/40* | (2010.01) |
| *H01L 33/42* | (2010.01) |
| *H01L 33/46* | (2010.01) |

(Continued)

(52) U.S. Cl.
CPC ............ *H01L 27/156* (2013.01); *G09G 3/32* (2013.01); *H01L 33/405* (2013.01); *H01L 33/42* (2013.01); *H01L 33/46* (2013.01); *H01L 33/50* (2013.01); *H01L 33/58* (2013.01); *H01L 33/62* (2013.01); *G09G 2300/0443* (2013.01); *H01L 2933/0016* (2013.01); *H01L 2933/0025* (2013.01); *H01L 2933/0041* (2013.01); *H01L 2933/0066* (2013.01)

(58) Field of Classification Search
CPC ..................................................... H01L 27/156
USPC ........................................................... 257/89
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |

(Continued)

FOREIGN PATENT DOCUMENTS

| | | |
|---|---|---|
| KR | 10-2019-0061227 A | 6/2019 |
| KR | 10-2097865 B1 | 5/2020 |
| KR | 10-2123018 B1 | 6/2020 |

*Primary Examiner* — Hsin Yi Hsieh
(74) *Attorney, Agent, or Firm* — Sughrue Mion, PLLC

(57) ABSTRACT

A display apparatus includes a circuit board including a driving circuit, and a pixel array including a plurality of pixels on the circuit board, each including a plurality of sub-pixels, and a light blocking partition between the plurality of sub-pixels. Each of the plurality of sub-pixels includes a lower light emitting diode (LED) cell configured to generate light of a first wavelength. A first sub-pixel includes a transparent resin structure on the first lower LED cell, a second sub-pixel includes an inter-cell insulating layer on the second lower LED cell and an upper LED cell having on the inter-cell insulating layer and configured to generate light of a second wavelength, and a third sub-pixel includes a wavelength conversion structure on the third lower LED cell and configured to convert light of the first wavelength into light of a third wavelength.

20 Claims, 39 Drawing Sheets

(51) Int. Cl.
　　*H01L 33/50*　　　(2010.01)
　　*H01L 33/58*　　　(2010.01)
　　*H01L 33/62*　　　(2010.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim et al. |
| 10,325,894 B1 * | 6/2019 | Pan ................. H01L 25/167 |
| 10,438,994 B2 | 10/2019 | Yeon et al. |
| 10,566,381 B2 | 2/2020 | Kwak et al. |
| 2019/0165037 A1 | 5/2019 | Chae et al. |
| 2020/0212017 A1 | 7/2020 | Oh et al. |
| 2021/0242368 A1 * | 8/2021 | Or-Bach ........... H01L 27/14694 |

* cited by examiner

LED DISPLAY APPARATUS

CROSS-REFERENCE TO RELATED APPLICATION(S)

This application is based on and claims priority under 35 U.S.C. § 119(a) to Korean Patent Application No. 10-2020-0142487 filed on Oct. 29, 2020 in the Korean Intellectual Property Office, the disclosure of which is incorporated by reference herein in its entirety.

BACKGROUND

Embodiments of the disclosure relate to a display apparatus having an LED.

Semiconductor light emitting diodes (LEDs) are not only used as light sources for lighting devices, but also used as light sources for various electronic products. For example, an LED is widely used as a light source for various display devices such as TVs, mobile phones, PCs, notebook PCs, and PDAs.

Related art display devices are mainly comprised of a display panel formed of a liquid crystal display (LCD) and a backlight, but recently, techniques have been developed in which a separate backlight using an LED element as a single pixel is not required. Such a display apparatus may be compact and may also be implemented as a high-brightness display device having superior light efficiency compared to related art LCDs.

SUMMARY

One or more example embodiments provide a high-efficiency LED display apparatus that may be manufactured in a simplified process.

According to an embodiment, there is provided a display apparatus including: a circuit board including a driving circuit; a pixel array including a plurality of pixels arranged on the circuit board, each of the plurality of pixels including a plurality of sub-pixels, the plurality of sub-pixels including at least a first sub-pixel, a second sub-pixel and a third sub-pixel, and a light blocking partition disposed between the plurality of sub-pixels, wherein each of the first sub-pixel, the second sub-pixel and the third sub-pixel includes a first lower light emitting diode (LED) cell, a second lower LED cell and a third lower LED cell, respectively, each of lower LED cells having a first semiconductor stack configured to generate light of a first wavelength, the first sub-pixel includes a transparent resin structure disposed on the first lower LED cell, the second sub-pixel includes an inter-cell insulating layer disposed on the second lower LED cell and an upper LED cell having a second semiconductor stack disposed on the inter-cell insulating layer, the second semiconductor stack being configured to generate light of a second wavelength, and the third sub-pixel includes a wavelength conversion structure disposed on the third lower LED cell and configured to convert light of the first wavelength into light of a third wavelength.

According to an embodiment, there is provided a display apparatus including: a circuit board including a driving circuit; and a pixel array including a plurality of pixels arranged on the circuit board, each of the plurality of pixels including a plurality of sub-pixels, the plurality of sub-pixels including a blue (B) sub-pixel, a green (G) sub-pixel and a red (R) sub-pixel, a light blocking partition disposed between the plurality of sub-pixels, and a wiring layer electrically connecting each of the plurality of sub-pixels to the driving circuit respectively, wherein each of the plurality of sub-pixels includes lower light emitting diode (LED) cells having a first semiconductor stack configured to generate blue light, the lower LED cells including a first lower LED cell, a second lower LED cell and a third lower LED cell, the blue sub-pixel includes a transparent resin structure disposed on the first lower LED cell, the green sub-pixel includes an inter-cell insulating layer disposed on the second lower LED cell, and an upper LED cell having a second semiconductor stack disposed on the inter-cell insulating layer, the second semiconductor stack being configured to generate green light, the red sub-pixel includes a wavelength conversion structure disposed on the third lower LED cell and configured to convert the blue light into red light, and the wiring layer includes a wiring insulating layer disposed between the circuit board and the pixel array, first to third electrodes penetrating through the wiring insulating layer and respectively connecting each of the plurality of sub-pixels to the driving circuit, and a common electrode connecting each of the plurality of sub-pixels to the driving circuit in common.

According to an embodiment, there is provided a display apparatus including: a circuit board including a driving circuit; and a pixel array including a wiring layer disposed on the circuit board, a pixel light source layer providing a light source for a plurality of pixels, each of the plurality of pixels including a plurality of sub-pixels having a first sub-pixel, a second sub-pixel, and a third sub-pixel, and a light blocking partition separating each of the plurality of sub-pixels, wherein the pixel light source layer is divided into a first level area and a second level area disposed on the first level area, the first level area includes lower light emitting diode (LED) cells disposed in each of the plurality of sub-pixels and each of the lower LED cells having a first semiconductor stack configured to generate light of a first wavelength, the lower LED cells including a first lower LED cell, a second lower LED cell and a third lower LED cell, and the second level area includes: a transparent resin structure disposed on the first lower LED cell, an inter-cell insulating layer disposed on the second lower LED cell, an upper LED cell disposed on the inter-cell insulating layer and having a second semiconductor stack configured to generate light of a second wavelength, and a wavelength conversion structure disposed on the third lower LED cell and configured to convert light of the first wavelength into light of a third wavelength.

According to an embodiment, there is provided a display apparatus including: a circuit board including a driving circuit; and a pixel array including a wiring layer disposed on the circuit board and a pixel light source layer providing a light source for a plurality of pixels, each of the plurality of pixels including a plurality of sub-pixels having a first sub-pixel, a second sub-pixel and a third sub-pixel, the pixel light source layer being divided into a first level area and a second level area disposed on the first level area, wherein the first level area includes lower LED cells in each of the plurality of sub-pixels, and each of the lower LED cells having a first semiconductor stack configured to generate light of a first wavelength, and the second level area includes a transparent resin structure disposed on the lower LED cell of the first sub-pixel, an inter-cell insulating layer disposed in the second sub-pixel, an upper LED cell having a second semiconductor stack disposed on the inter-cell insulating layer and configured to generate light of a second wavelength, and a wavelength conversion structure disposed on the lower LED cell of the third sub-pixel and configured to convert light of the first wavelength into light of a third wavelength.

BRIEF DESCRIPTION OF THE DRAWINGS

The above and other aspects, features, and advantages of the present inventive concept will be more clearly understood from the following detailed description, taken in conjunction with the accompanying drawings, in which.

DETAILED DESCRIPTION

Figure 1:
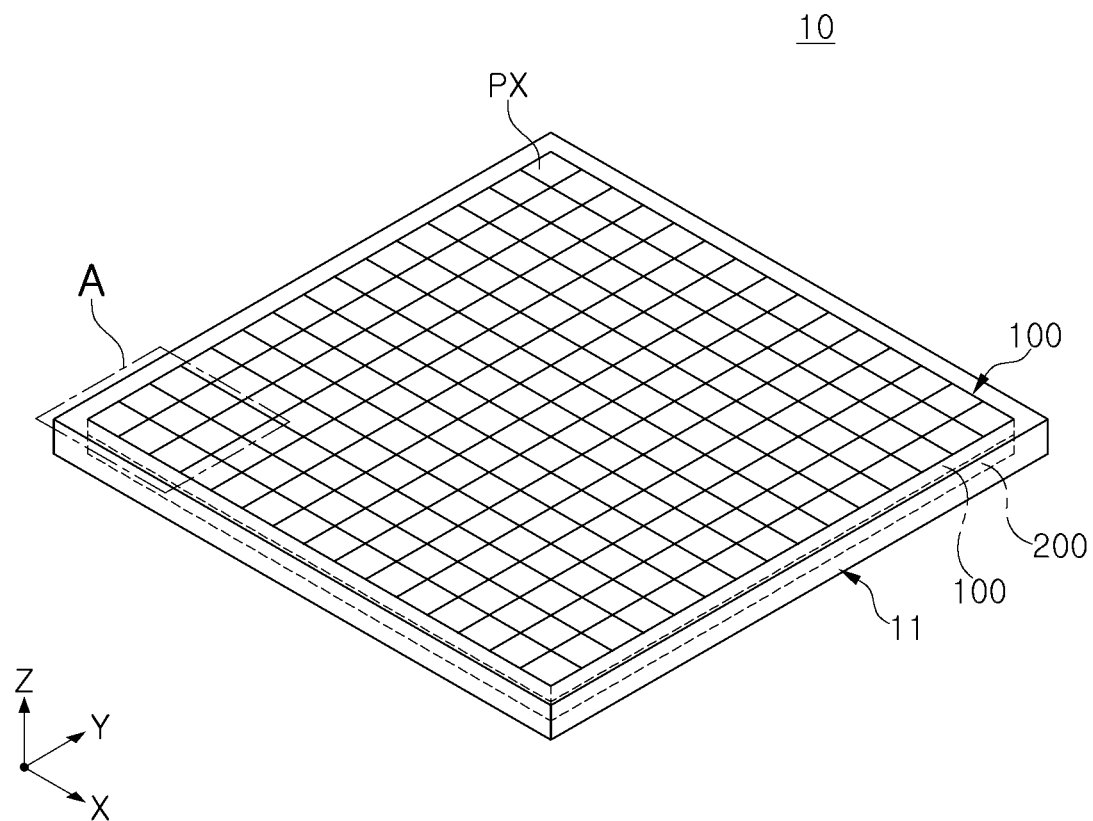
FIG. 1 is a schematic perspective view of an LED display apparatus according to an example embodiment.

Hereinafter, example embodiments will be described with reference to the accompanying drawings.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

One or more embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the one or more embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices may or may not be described in detail herein. However, even if a certain element is described or illustrated in a semiconductor device in this disclosure, the element may not be included in a claimed semiconductor device unless the element is recited as being included in the claimed semiconductor device.

Figure 2:
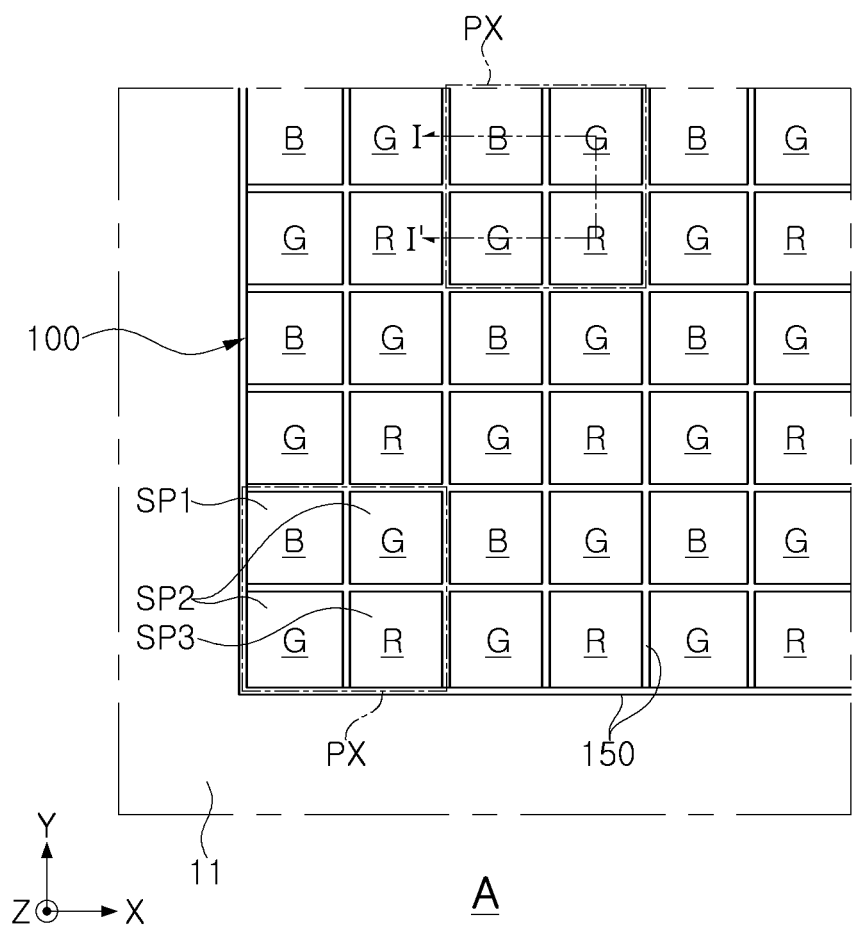
FIG. 2 is an enlarged plan view illustrating the portion A of FIG. 1.

FIG. 1 is a schematic perspective view of an LED display apparatus according to an example embodiment, and FIG. 2 is an enlarged plan view illustrating the portion "A" of FIG. 1.

Referring to FIGS. 1 and 2, a display apparatus 10 according to an example embodiment includes a circuit board 200 including a driving circuit and a pixel array 100 (also referred to as "LED module for display"). The pixel array 100 may be disposed on the circuit board 200 and may include a plurality of pixels PX. In addition, the display apparatus 10 may further include a frame 11 surrounding the circuit board 200 and the pixel array 100.

Each of the plurality of pixels PX according to an embodiment may include a first sub-pixel SP1, a second sub-pixel SP2 and a third sub-pixel SP3 configured to emit light of a specific wavelength (e.g., color) to provide a color image. For example, the first to third sub-pixels SP1, SP2 and SP3 may be configured to emit red light, green light, and blue light, respectively. In each pixel, the first to third sub-pixels SP1, SP2 and SP3 may be arranged in a Bayer pattern. For example, the plurality of pixels PX may include a first sub-pixel SP1 and a third sub-pixel SP3 arranged in a first diagonal direction, and two second sub-pixels SP2 arranged in a second diagonal direction intersecting the first diagonal direction.

In this embodiment, the pixel PX is illustrated in a form in which the first to third sub-pixels SP1, SP2 and SP3 are arranged in a 2×2 Bayer pattern, but the arrangement form is not limited thereto, and in other embodiments, respective pixels (PX) may be configured in different arrangement forms such as 3×3 or 4×4. In addition, some sub-pixels may also be configured to emit light of a different color (e.g., yellow) from the illustrated colors (R, G, B).

As illustrated in FIG. 1, the pixel (PX) array in this embodiment may be in a 15×15 arrangement, but the number of rows and columns may be implemented as any appropriate number (e.g., 1,024×768). Depending on a required resolution, the pixel array may have a different arrangement.

The frame 11 may be disposed around the LED module 100 and provided as a guide defining an arrangement space of the array of pixels PX. The frame 11 may include, for example, at least one of a material such as a polymer, ceramic, semiconductor, or metal. In a specific example, the frame 11 may include a black matrix. The frame 11 is not limited to a black matrix, and a white matrix or other colored structure may be used for the frame 11 depending on the use of a product. For example, the white matrix may include a reflective material or a scattering material.

The display apparatus 10 in this embodiment is illustrated as having a quadrangular planar structure, but may have a structure of a different shape. In some embodiments, the circuit board 200 may be a driving circuit board including TFT cells. In some embodiments, the circuit board 200 may include a portion of a driving circuit for a display apparatus and other driving devices. In some embodiments, the circuit board 200 may be formed using a flexible substrate to implement a display apparatus having a curved profile.

Figure 3:
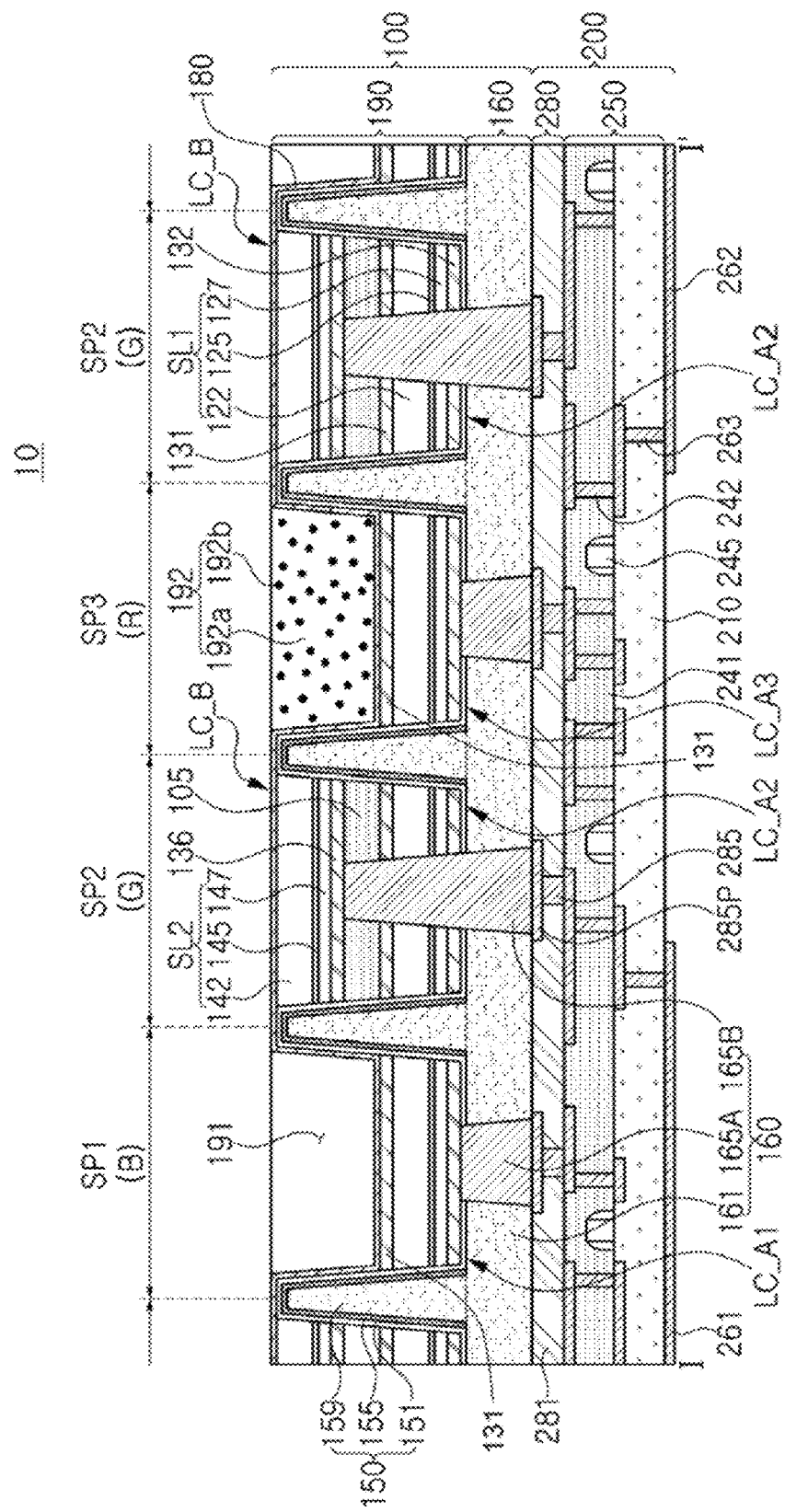
FIG. 3 is a side cross-sectional view taken along line I-I' of FIG. 2.

In this embodiment, light sources of the first to third sub-pixels SP1, SP2 and SP3 may be implemented by LED cells arranged in a two-level stack structure, as illustrated in FIG. 3. FIG. 3 is a cross-sectional side view of the display apparatus illustrated in FIG. 2, taken along line I-I'.

Referring to FIG. 3, a display panel 10 according to this embodiment includes a circuit board 200 and a pixel array 100 disposed on the circuit board 200. The pixel array 100 includes a plurality of pixels arranged on the circuit board 200 as described in FIGS. 1 and 2. The cross-sectional view illustrated in FIG. 3 may be understood as an example of the structure of one pixel PX among the plurality of pixels.

The pixel array 100 may include a wiring layer 160 disposed on the circuit board 200, and a pixel light source layer 190 disposed on the wiring layer 160 and providing a light source for the respective first to third sub-pixels SP1, SP2 and SP3. The pixel array 100 may include a light blocking partition 150 disposed between the first to third sub-pixels SP1, SP2 and SP3.

The first to third sub-pixels SP1, SP2 and SP3 may include a first lower LED cell LC_A1, a second lower LED cell LC_A2, and a third lower LED cell LC_A3. Specifically, the first sub-pixel SP1 may include the first lower LED cell LC_A1, the second sub-pixel SP2 may include the second lower LED cell LC_A2, and the third sub-pixel SP3 may include the third lower LED cell LC_A3. Each of the first to third sub-pixels SP1, SP2 and SP3 may include a first semiconductor stack SL1 configured to generate light of a first wavelength. For example, the light of the first wavelength may be blue light (e.g., 435 nm to 460 nm).

The first semiconductor stack SL1 may include a first conductivity-type semiconductor layer 122, an active layer 125, and a second conductivity-type semiconductor layer 127. In some embodiments, the first semiconductor stack SL1 may include a nitride semiconductor. For example, the first conductivity-type semiconductor layer 122 may include a nitride semiconductor of n-type $In_xAl_yGa_{1-x-y}N$ ($0 \leq x<1$, $0 \leq y<1$, $0 \leq x+y<1$), and for example, the n-type impurity may include Si, Ge, Se or Te. The active layer 125 may have a multiple quantum well (MQW) structure in which a quantum well layer and a quantum barrier layer are alternately stacked with each other. For example, the quantum well layer and the quantum barrier layer may be $In_xAl_yGa_{1-x-y}N$ ($0 \leq x \leq 1$, $0 \leq y \leq 1$, $0 \leq x+y \leq 1$) layers having different compositions. In a specific example, the quantum well layer may be $In_xGa_{1-x}N$ ($0<x \leq 1$), and the quantum barrier layer may be GaN or AlGaN. For example, as described above, the active layer 125 may be configured to emit blue light (e.g., 435 nm to 460 nm). The second conductivity-type semiconductor layer 127 may include a nitride semiconductor layer of p-type $In_xAl_yGa_{1-x-y}N$ ($0 \leq x<1$, $0 \leq y<1$, $0 \leq x+y<1$), and for example, the p-type impurity may include Mg, Zn or Be. It should be understood that, while the first semiconductor stack SL1 is shown only with respect to one of the second sub-pixels SP2, each of the first to third sub-pixels SP1, SP2 and SP3 may include the first semiconductor stack SL1 including the first conductivity-type semiconductor layer 122, the active layer 125 and the second conductivity-type semiconductor layer 127.

The first sub-pixel SP1 may include a transparent resin structure 191 (or a transparent resin layer) disposed on the first lower LED cell LC_A1. For example, the transparent resin structure 191 may include a transparent resin such as a silicone resin or an epoxy resin, or a silicon oxide such as $SiO_2$. In the first sub-pixel SP1, blue light B generated from the first lower LED cell LC_A1 may be emitted through the transparent resin structure 191 as is.

The third sub-pixel SP3 may further include a wavelength conversion structure 192 (or wavelength conversion layer) disposed on the third lower LED cell LC_A3. The wavelength conversion structure 192 may be configured to convert light of the first wavelength into light of a third wavelength. In some embodiments, the wavelength conversion structure 192 may include a wavelength conversion material 192a converting light of the first wavelength (e.g., blue light) into light of a third wavelength (e.g., red light), and a transparent resin 192b mixed with the wavelength conversion material 192a. For example, the wavelength conversion material 192a may be a phosphor or a quantum dot. In the third sub-pixel SP3, blue light generated from the third lower LED cell LC_A3 may be converted into red light R through the wavelength conversion structure 192 and then emitted.

The second sub-pixels SP2 may include an inter-cell insulating layer 105 disposed on the second lower LED cell LC_A2, and an upper LED cell LC_B having a second semiconductor stack SL2 disposed on the inter-cell insulating layer 105 and configured to generate light (e.g., green light) of a second wavelength. The inter-cell insulating layer 105 electrically separates the second lower LED cell LC_A2 and the upper LED cell LC_B. From a process point of view, the inter-cell insulating layer 105 may be an oxide layer for wafer bonding the first semiconductor stack SL1 and the second semiconductor stack SL2 (see FIGS. 8C and 9). For example, the inter-cell insulating layer 105 may include at least one of $SiO_2$, SiN, SiCN, SiOC, SiON and SiOCN.

Similar to the first semiconductor stack SL1, the second semiconductor stack SL2 may include a first conductivity-type semiconductor layer 142, an active layer 145, and a second conductivity-type semiconductor layer 147. However, as described above, the active layer 145 of the second semiconductor stack SL2 may be configured to emit green light (e.g., 480 nm to 530 nm). In the second sub-pixels SP2, the second lower LED cells LC_A2 are not driven, but only the upper LED cells LC_B are driven, thereby emitting the green light G generated from the upper LED cell LC_B.

As described above, a first level area of the pixel light source layer 190 may include first to third lower LED cells LC_A1, LC_A2 and LC_A3 including the first semiconductor stack SL1 in common. On the other hand, a second level area located on the first level area may be implemented differently for the respective first to third sub-pixels SP1, SP2 and SP3 to emit light of different colors.

In the first and second semiconductor stacks SL1 and SL2 located in the first and second level areas, respectively, the second conductivity-type semiconductor layers 127 and 147 may be disposed closer to the circuit board 200 than the first conductivity-type semiconductor layers 122 and 142.

Each of the first to third lower LED cells LC_A1, LC_A2, and LC_A3 may include an ohmic contact layer 132 disposed on a lower surface of the second conductivity-type semiconductor layer 127. Similarly, the upper LED cell LC_B may include an ohmic contact layer 136 disposed on a lower surface of the second conductivity-type semiconductor layer 147. The ohmic contact layers 132 and 136 may include a highly reflective metal. For example, the ohmic contact layers 132 and 136 may include a material such as Ag, Ni, Al, Cr, Rh, Pd, Ir, Ru, Mg, Zn, Pt, Au or the like.

On the other hand, each of the first to third lower LED cells LC_A1, LC_A2, and LC_A3 may include a light-transmitting contact layer 131 disposed on an upper surface of the first conductivity-type semiconductor layer 122. For example, the light-transmitting contact layer 131 may include ITO, ZITO, ZIO, GIO, ZTO, FTO, AZO, GZO, $In_4Sn_3O_{12}$ or $Zn_{(1-x)}Mg_xO$ (0≤x≤1). Similarly, the upper LED cell LC_B may include a light-transmitting ohmic contact layer disposed on an upper surface of the first conductivity-type semiconductor layer 142. The aforementioned inter-cell insulating layer 105 may be disposed between the light-transmitting contact layer 131 of the second lower LED cell LC_A2 and the highly reflective ohmic contact layer 136 of the upper LED cell LC_B.

The wiring layer 160 in this embodiment may include a wiring insulating layer 161 disposed between the circuit board 200 and the pixel light source layer 190, first and third individual electrodes 165A and second individual electrode 165B penetrating through the wiring insulating layer 161 and connecting the respective first to third sub-pixels SP1, SP2 and SP3 to the driving circuit, and a common electrode structure commonly connecting the first to third sub-pixels SP1, SP2 and SP3 to the driving circuit. Specifically, the first and third individual electrodes 165A may be connected to the first sub-pixel SP1 and the third sub-pixel SP3 respectively, and the second individual electrode 165B may be connected to the second sub-pixels SP2.

For example, the first and third individual electrodes 165A may penetrate through the wiring insulating layer 161 and may electrically connect the second conductivity-type semiconductor layers 127 of the first LED cell LC_A1 and the third lower LED cell LC_A3, respectively, and the driving circuit. On the other hand, the second individual electrode 165B may penetrate through the wiring insulating layer 161, the second lower LED cell LC_A2, the first semiconductor stack SL1 and the inter-cell insulating layer 105 portion to electrically connect the second conductivity-type semiconductor layer 127 of the upper LED cell LC_B and the driving circuit. In this embodiment, the second lower LED cell LC_A2 penetrated by the second individual electrode 165B may be an inactive LED cell that is not driven.

Figure 4:
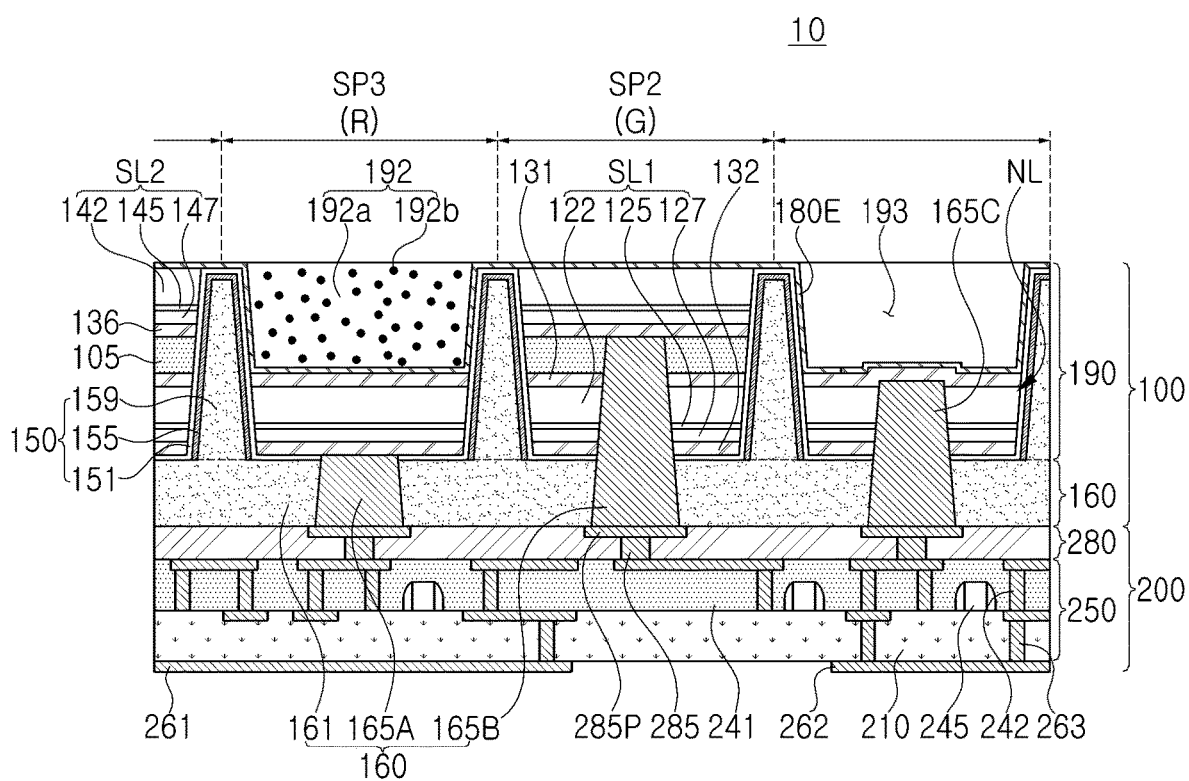
FIG. 4 is a side cross-sectional view illustrating a structure of a common electrode of an LED display panel according to an example embodiment.

The common electrode structure in this embodiment may include a transparent electrode layer 180 disposed on the first conductivity-type semiconductor layer 142 of the upper LED cell LC_B and extending to the first conductivity-type semiconductor layer 122 of the first and third lower LED cells LC_A1 and LC_A3 as illustrated in FIG. 3. In addition, as illustrated in FIG. 4, the transparent electrode layer 180 may have a portion extending to another inactive LED cell NL. The common electrode 165C penetrating through the wiring insulating layer 161 and another inactive LED cell LC may connect the extended portion of the transparent electrode layer 180 to the driving circuit. The common electrode 165C may be manufactured together with the first and third individual electrodes 165A and the second individual electrode 165B.

In this embodiment, the first to third lower LED cells LC_A1, LC_A2, and LC_A3 and the upper LED cell LC_B may each have a side surface inclined downwardly. In the case of the second sub-pixel SP2, side surfaces of the second lower LED cell LC_A2, the inter-cell insulating layer 105, and the upper LED cell LC_B may provide continuously inclined side surfaces. This continuously inclined side surface may be understood as a side formed in an etching process performed in a single direction (see FIG. 10A).

The light blocking partition 150 is introduced to prevent optical interference between the first to third sub-pixels SP1, SP2 and SP3. The light blocking partition 150 has a structure extending from the lower surfaces of the first to third sub-pixels SP1, SP2 and SP3 toward the upper surfaces of the first to third sub-pixels SP1, SP2 and SP3. In this embodiment, the light blocking partition 150 may have a tapered shape in which a width of an upper end is less than a width of a lower end.

The light blocking partition 150 may include an insulating film 151 disposed on side surfaces of the first to third sub-pixels SP1, SP2 and SP3, a reflective metal film 155 disposed on the insulating film 151, and a filling insulating structure 159 (or filling insulating layer) disposed on the reflective metal film 155.

For example, the insulating film 151 may include at least one of SiO2, SiN, SiCN, SiOC, SiON, and SiOCN. The insulating film 151 may be formed relatively conformally. For example, the reflective metal film 155 may include Ag, Ni, or Al. The filling insulating structure 159 may include a silicon oxide or a silicon oxide-based insulating material, for example, TetraEthyl Ortho Silicate (TEOS), Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or combinations thereof. The reflective structure of the light blocking partition 150 may be implemented as a distributed Bragg reflection (DBR) layer or an omni-directional reflection (ODR) layer. For example, the distributed Bragg reflection (DBR) layer may be formed by alternately stacking first and second dielectric layers having different refractive indices. A dielectric DBR layer may be formed instead of the reflective metal film 155, and in this case, the insulating film 151 may be omitted.

The light blocking partition 150 in this embodiment may have a height corresponding to the thickness of the first to third sub-pixels SP1, SP2 and SP3. For example, the upper end of the light blocking partition 150 may be positioned on substantially the same level as the upper surface of the upper LED cell LC_B. The transparent electrode layer 180 may extend to the first conductivity-type semiconductor layer 122 of the first and third lower LED cells LC_A1 and LC_A3 along an upper end of the light blocking partition 150 and a side surface adjacent to the first and third sub-pixels SP1 and SP3. In this case, an upper end of the light blocking partition 150 may be provided by the insulating film 151.

The circuit board 200 in this embodiment may include a wiring connection layer 280, and a device layer 250 in which a driving circuit including a plurality of TFT cells 245 is implemented. The device layer 250 may include a driving circuit including a semiconductor substrate 210 and a TFT cell 245 formed on the semiconductor substrate 210, and an interconnection portion 242 electrically connected to the TFT cell 245, and an interlayer insulating film 241 disposed on the semiconductor substrate 210 and covering the driving circuit and the interconnection portion 242. For example, the semiconductor substrate 210 may include a semiconductor such as Si or Ge, or a compound semiconductor such as SiGe, SiC, GaAs, InAs, or InP.

The wiring connection layer 280 may include a dielectric layer 281 disposed on the interlayer insulating film 241 and a metal wiring 285 disposed on the dielectric layer 281 and connected to the interconnection portion 242. The metal wiring 285 may be electrically connected to the driving circuit through the interconnection portion 242. The dielectric layer 281 may have a substantially flat surface in contact with the surface of a planarization layer 161.

The wiring connection layer 280 may include a bonding pad 285P disposed on the metal wiring 285 and exposed to the wiring layer 160. The bonding pad 285P may have a surface that is substantially flat and coplanar with the surface of the dielectric layer 281. The flat surface of the dielectric layer 281 is bonded to the flat bottom surface of the wiring layer 160, and the bonding pads 285P are respectively connected to the first and third individual electrodes 165A and the second individual electrode 165B and the common electrode 165C.

The driving circuit including the plurality of TFT cells 245 implemented on the circuit board 200 may be a driving circuit for controlling driving of a pixel (in detail, a sub-pixel). The semiconductor substrate 210 may include a through-electrode 263 such as a through-silicon via (TSV) connected to the driving circuit, and first and second wiring lines 261 and 262 connected to the through-electrode. For example, the drain regions of the plurality of TFT cells 245 may be connected to the first wiring line 261 through the through-electrode 263, and the first wiring line 261 may be connected to a data line.

Figure 5:
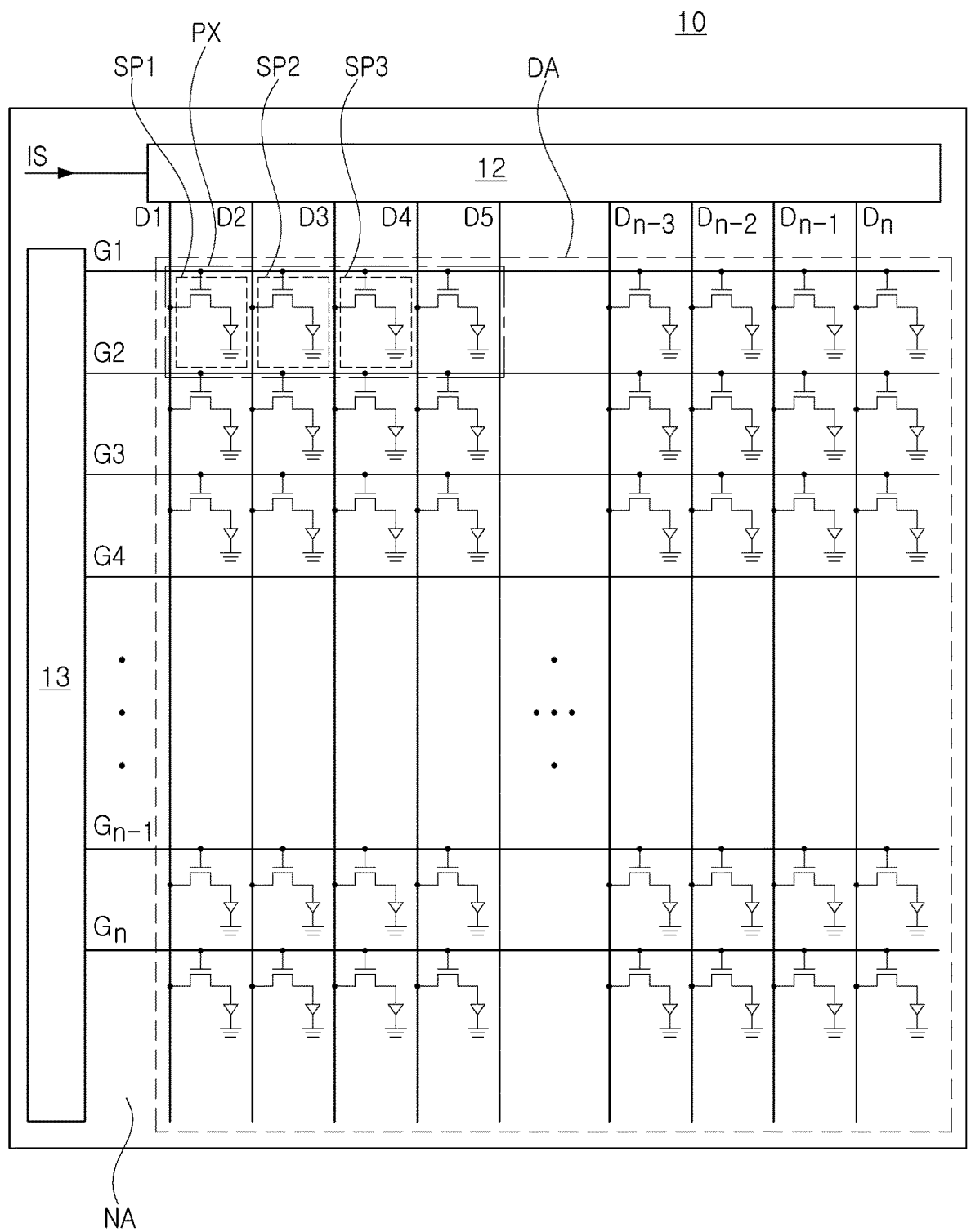
FIG. 5 is a driving circuit diagram of a display apparatus according to an example embodiment.

FIG. 5 illustrates a driving circuit implemented in a display apparatus according to an example embodiment.

Referring to FIG. 5, a circuit diagram of a display panel 10 in which n×n sub-pixels are arranged is illustrated. The first to third sub-pixels SP1, SP2 and SP3 may receive data signals through data lines D1 to Dn, which are paths in the vertical direction (row direction), respectively. The first to third sub-pixels SP1, SP2 and SP3 may receive a control signal (e.g., a gate signal) through gate lines G1 to Gn which are horizontal (column) paths.

A plurality of pixels 10 including the first to third sub-pixels SP1, SP2, and SP3 provide an active area DA for display, and the active area DA is provided as a display area for a user. An inactive area NA of the display panel 10 may be formed along one or more edges of the active area DA. In the inactive area NA, the pixel PX is not present along the outer periphery of the display panel 10 and may correspond to the frame 11 of the display panel 10.

A first driver circuit 12 and a second driver circuit 13 may be configured to control the operation of the pixel PX, for example, the plurality of sub-pixels SP1, SP2 and SP3. Some or all of these first and second driver circuits 12 and 13 may be implemented on the device layer 250 of the circuit board 200. The first and second driver circuits 12 and 13 may be formed as an integrated circuit, a thin film transistor panel circuit, or other suitable circuit, and may be disposed in the inactive area NA of the display panel 10. The first and second driver circuits 12 and 13 may include a microprocessor, a memory such as a storage, a processing circuit and a communication circuit. During operation, a system control circuit may supply image information IS to be displayed on the display panel 10 to the first and second driver circuits 12 and 13.

To display an image on the pixel PX, the first driver circuit 12 may transmit a clock signal and other control signals to the second driver circuit 13 (also, referred to as a 'gate driver circuit'), while supplying image data to data lines D1 to Dn. The second driver circuit 13 may be implemented using an integrated circuit and/or a thin film transistor circuit. A gate signal for controlling the first to third sub-pixels SP1, SP2 and SP3 arranged in the column direction may be transmitted through gate lines G1 to Gn of the display apparatus.

As described above, the LED display apparatus according to this embodiment provides a light source of a two-level structure having a lower LED cell and an upper LED cell, emitting light of different wavelengths, and partially introduces a light conversion structure at the upper level, thereby implementing required pixels. The LED display apparatus according to this embodiment may be implemented by changing into various structures.

Figure 6:
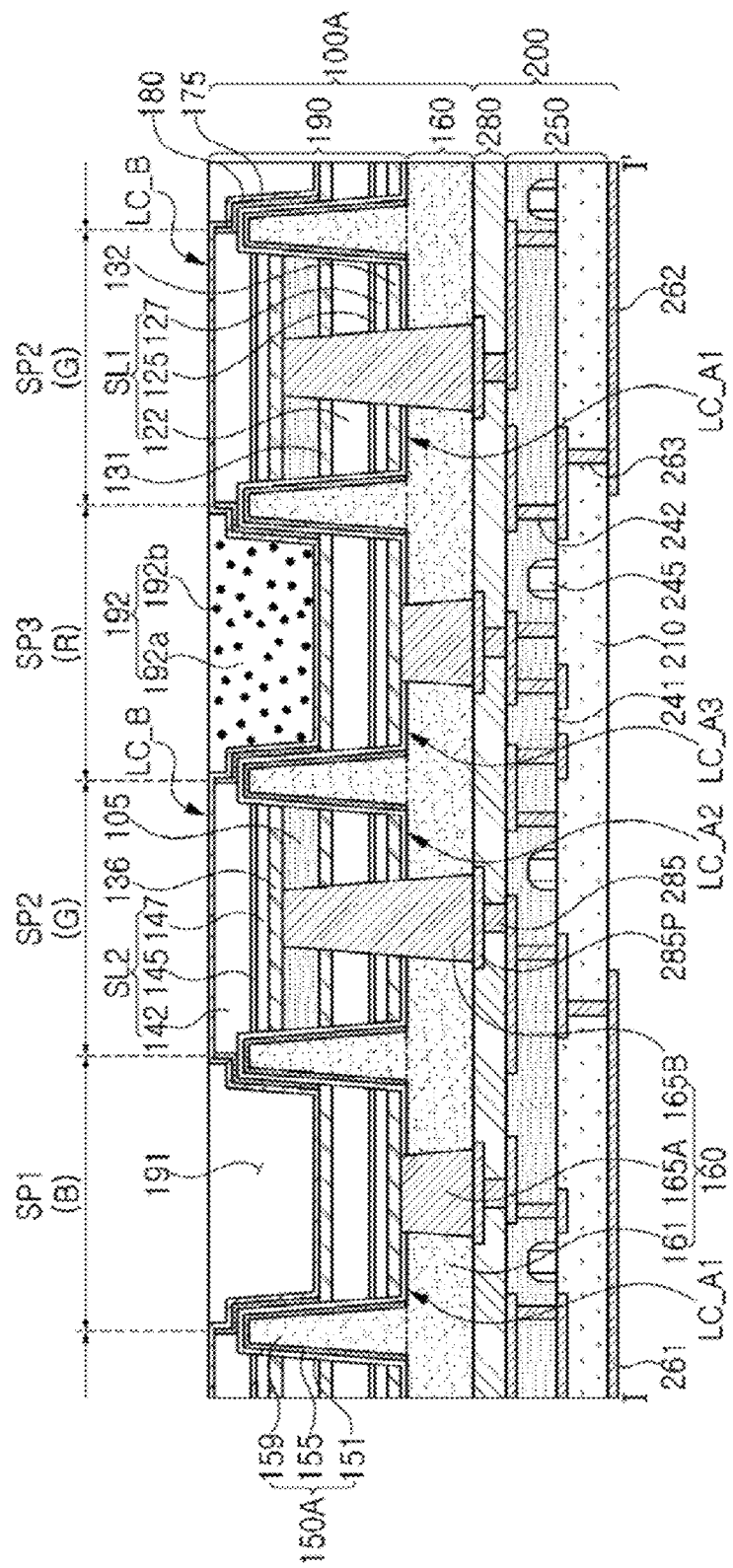
FIG. 6 is a side cross-sectional view of an LED display apparatus according to an example embodiment.

FIG. 6 is a side cross-sectional view of an LED display apparatus according to an example embodiment.

Referring to FIG. 6, an LED display apparatus 10A according to an example embodiment may be understood as having a structure similar to the LED display apparatus 10 illustrated in FIGS. 1 to 4, except that a height of a light blocking partition 150A is lower than the heights of the first to third sub-pixels SP1, SP2 and SP3, and an additional side reflective layer is introduced. Components of this embodiment may be understood with reference to descriptions of the same or similar components of the LED display apparatus 10 illustrated in FIGS. 1 to 4 unless otherwise specified.

Unlike the embodiments described above, the light blocking partition 150A in this embodiment has an upper end located higher than an active layer 145 of the upper LED cell LC_B and lower than the upper surface of the upper LED cell LC_B. Optical interference between the sub-pixels SP1, SP2 and SP3 may occur due to the light blocking partition 150A having a relatively low height. To prevent optical interference, the pixel array 100 may further include a side reflective layer 175 disposed in a side area of the upper LED cell LC_B higher than an upper end of the light blocking partition 150A. The side reflective layer 175 may extend to a side surface of the light blocking partition 150A, adjacent to the first and third sub-pixels SP1, SP2 and SP3.

As described above, in this embodiment, the side reflective layer 175 may be provided in a structure that prevents optical interference between the sub-pixels SP1, SP2 and SP3, together with the light blocking partition 150A.

Figure 7:
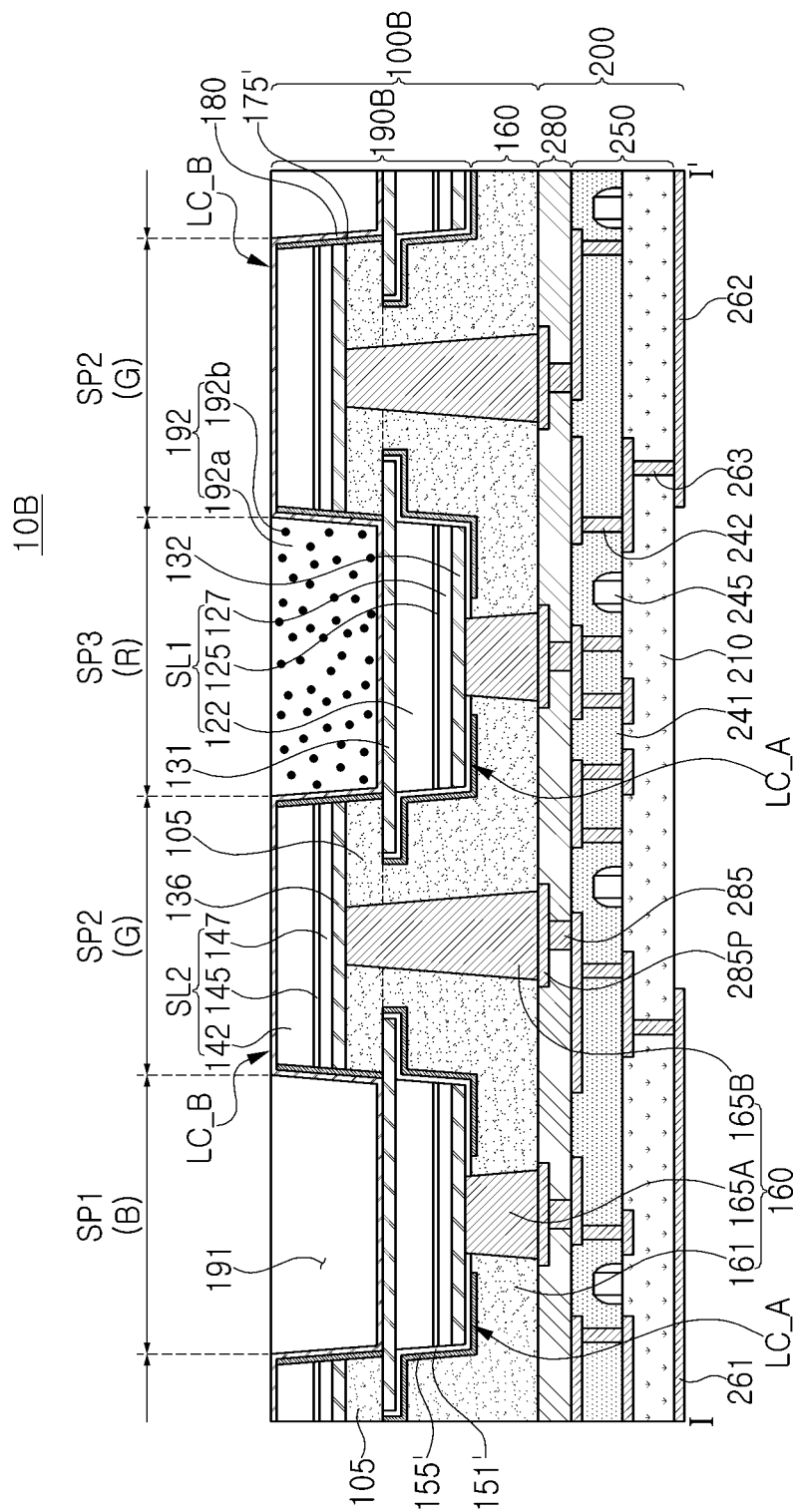
FIG. 7 is a side cross-sectional view of an LED display apparatus according to an example embodiment.

FIG. 7 is a side cross-sectional view of an LED display apparatus according to an example embodiment.

Referring to FIG. 7, a display panel 10B according to an example embodiment includes a circuit board 200 and a pixel array 100B disposed on the circuit board 200. The pixel array 100B includes a plurality of pixels having a pattern similar to that of the embodiments described above. Components of this embodiment may be understood with reference to the description of the same or similar components of the LED display apparatus 10 described in FIGS. 1 to 4 unless indicated otherwise.

The pixel array 100B in this embodiment may include a wiring layer 160 disposed on a circuit board 200, and a pixel light source layer 190B respectively providing a light source of the first to third sub-pixels SP1, SP2 and SP3 arranged on the wiring layer 160. The pixel light source layer 190B may be divided into a first level area and a second level area disposed on the first level area.

The first level area is located in each of the first and third sub-pixels SP1, SP2, SP3, and may include lower LED cells LC_A having a first semiconductor stack SL1 configured to generate light of a first wavelength. On the other hand, the second level area may include a transparent resin structure 191 disposed on the lower LED cell LC_A of the first sub-pixel SP1, and a wavelength conversion structure 192 disposed on the lower LED cell LC_A of the third sub-pixel SP3 and configured to convert the light of the first wavelength into light of the third wavelength. In addition, the second level area may include an inter-cell insulating layer 105 disposed in the second sub-pixel SP2, and an upper LED cell LC_A having a second semiconductor stack SL2 disposed on the inter-cell insulating layer 105 and configured to generate light of a second wavelength.

In this embodiment, unlike the embodiments described above, lower LED cells LC_A are not disposed in the first level area of the second sub-pixel SP2, and a portion of the wiring insulating layer 161 may extend to the second level area.

In addition, in place of the light blocking partition 150 of the embodiments described above, the pixel array 200 in this embodiment may further include a first reflective layer 155' disposed on side surfaces and lower surfaces of the lower LED cells LC_A, and a second reflective layer 175' disposed on side surfaces of the upper LED cell LC_B and the inter-cell insulating layer 105. The first and second reflective layers 155' and 175' may be provided after forming an insulating film 151' on the surfaces of the lower LED cells LC_A and the upper LED cell LC_B. In another embodiment, at least one of the first and second reflective layers may replace the DBR layer. In this case, the insulating film 151' may be omitted.

Similar to the embodiments described above, the first and second semiconductor stacks SL1 and SL2 may include first conductivity-type semiconductor layers 122 and 142, active layers 125 and 145, and second conductivity-type semiconductor layers 127 and 147, respectively. The second conductivity-type semiconductor layers 127 and 147 may be disposed adjacent to the circuit board 200 than the first conductivity-type semiconductor layers 122 and 142.

Each of the lower LED cells LC_A may further include a highly reflective ohmic contact layer 132 disposed on a lower surface of the second conductivity-type semiconductor layer 127, and a light-transmitting contact layer 131 disposed on an upper surface of the first conductivity-type semiconductor layer 122. In addition, the upper LED cell LC_B may further include a highly reflective ohmic contact layer 136 disposed on a lower surface of the second conductivity-type semiconductor layer 147.

In this embodiment, the light-transmitting contact layer 131 of the lower LED cells LC_A may have an extension portion overlapping the upper LED cell LC_B in a vertical direction. For example, the light-transmitting contact layer 131 may have a larger area than the area of the lower LED cells LC_A. The first reflective layer 155' may extend to a lower surface of the extension portion of the light-transmitting contact layer 131.

In this embodiment, each of the lower LED cells LC_A may have a side surface inclined in a downward direction, and conversely, the upper LED cell LC_B may have a side surface inclined in an upward direction. The upper LED cell LC_B may have a side surface inclined continuously with the inter-cell insulating layer 105.

The wiring layer 160 may include a wiring insulating layer 161 disposed between the circuit board 200 and a pixel light source layer 160B, the first and third individual electrodes 165A and the second individual electrode 165B penetrating through the wiring insulating layer 161 and connecting the respective first to third sub-pixels SP1, SP2 and SP3 to the driving circuit and a common electrode layer 180 commonly connecting the first to third sub-pixels SP1, SP2, and SP3 to the driving circuit.

Specifically, the first and third individual electrodes 165A may penetrate through the wiring insulating layer 161 and may electrically connect the second conductivity-type semiconductor layer 127 of the lower LED cells LC_A and the driving circuit. On the other hand, the second individual electrode 165B may penetrate through the wiring insulating layer 161 and the inter-cell insulating layer 105, and may electrically connect the second conductivity-type semiconductor layer 127 of the upper LED cell LC_B and the driving circuit.

FIGS. 8A to 8D are cross-sectional views illustrating a process of forming an epitaxial bonding structure for a pixel light source layer in a method of manufacturing an LED display apparatus according to an example embodiment.

Figure 8A:
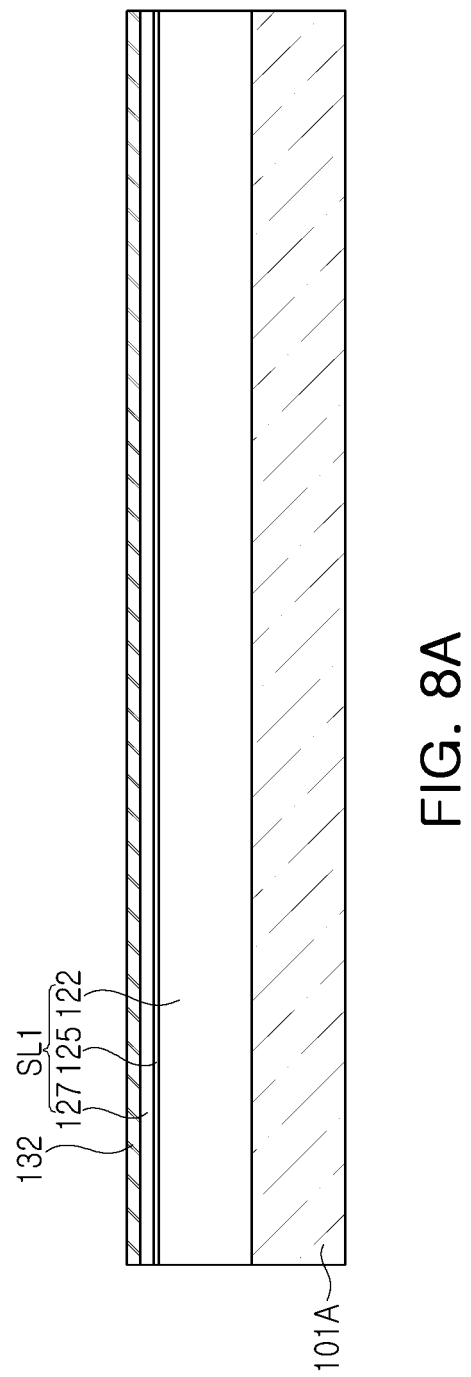
FIGS. 8A to 8D are cross-sectional views illustrating a method of manufacturing an LED display apparatus according to an example embodiment.

First, referring to FIG. 8A, a first semiconductor stack SL1 may be formed on a first growth substrate 101.

A first growth substrate 101A may include an insulating, conductive or semiconductor material such as sapphire, Si, SiC, $MgAl_2O_4$, MgO, $LiAlO_2$, $LiGaO_2$, GaN, or the like. The first semiconductor stack SL1 may include a first conductivity-type semiconductor layer 122, an active layer 125, and a second conductivity-type semiconductor layer 127 sequentially formed on the first growth substrate 101A.

For example, each layer of the first semiconductor stack SL1 may be a nitride semiconductor layer, as described above, and may be grown using a process such as metal organic chemical vapor deposition (MOCVD), hydride vapor phase epitaxy (HVPE), Molecular Beam Epitaxy (MBE), or the like.

Although not illustrated in the drawings, before forming the first semiconductor stack SL1, a buffer layer and an undoped semiconductor layer (e.g., undoped GaN) may be additionally formed on the upper surface of the first growth substrate 101A. The first conductivity-type semiconductor layer 122 may be formed of a semiconductor doped with n-type impurities, and may be an n-type nitride semiconductor layer. The second conductivity-type semiconductor layer 127 may be formed of a semiconductor doped with p-type impurities, and may be a p-type nitride semiconductor layer. As described above, the active layer 125 may be configured to emit light (e.g., blue light) of a first wavelength.

Additionally, an ohmic contact layer 132 may be formed on the second conductivity-type semiconductor layer 127. In some embodiments, the ohmic contact layer 132 may be a highly reflective ohmic contact layer. For example, the highly reflective ohmic contact layer may include Ag, Cr, Ni, Ti, Al, Rh, Ru, Au, or combinations thereof.

Figure 8B:
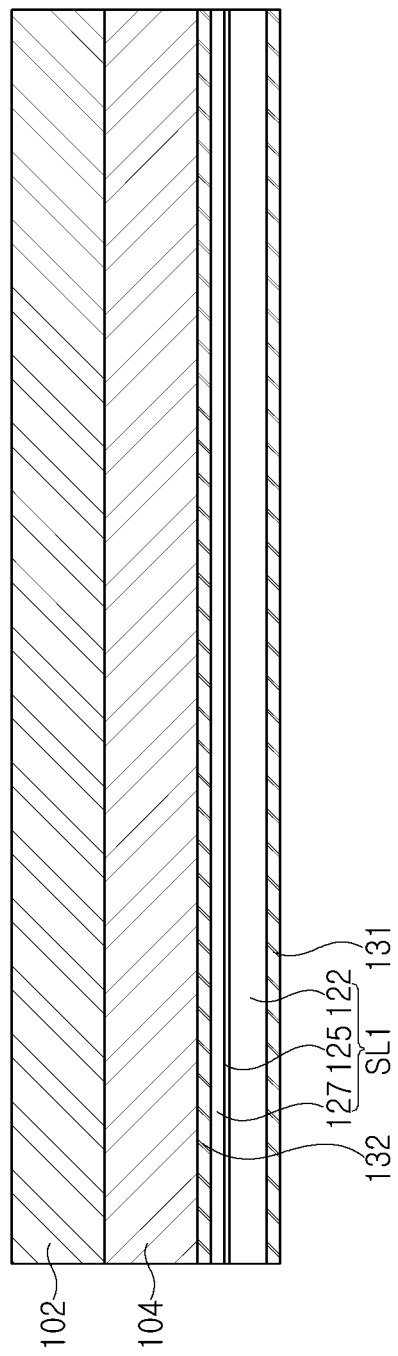

Next, referring to FIG. 8B, support structures 102 and 104 are bonded to the upper surface of the first semiconductor stack SL1, and a light-transmitting ohmic contact layer 131 may be formed on the lower surface of the first semiconductor stack SL1, for example, the first conductivity-type semiconductor layer 122.

The support structure according to an embodiment may include a support substrate 102 such as a silicon substrate, and a dielectric layer 104 such as silicon oxide. After depositing the dielectric layer 104 on the support substrate 102, the upper surface of the dielectric layer 104 may be planarized, and fusion bonding may be performed on the highly reflective ohmic contact layer 131. After fusion bonding, the first growth substrate 101A may be removed, and a light-transmitting ohmic contact layer 131 may be formed on the first conductivity-type semiconductor layer 122. After the removal of the first growth substrate 101A, a grinding process may be performed to additionally remove a buffer layer and the undoped semiconductor layer. For example, the light-transmitting ohmic contact layer 131 may include ITO, ZITO, ZIO, GIO, ZTO, FTO, AZO, GZO, $In_4Sn_3O_{12}$ or $Zn_{(1-x)}Mg_xO$ ($0 \leq x \leq 1$).

Figure 8C:
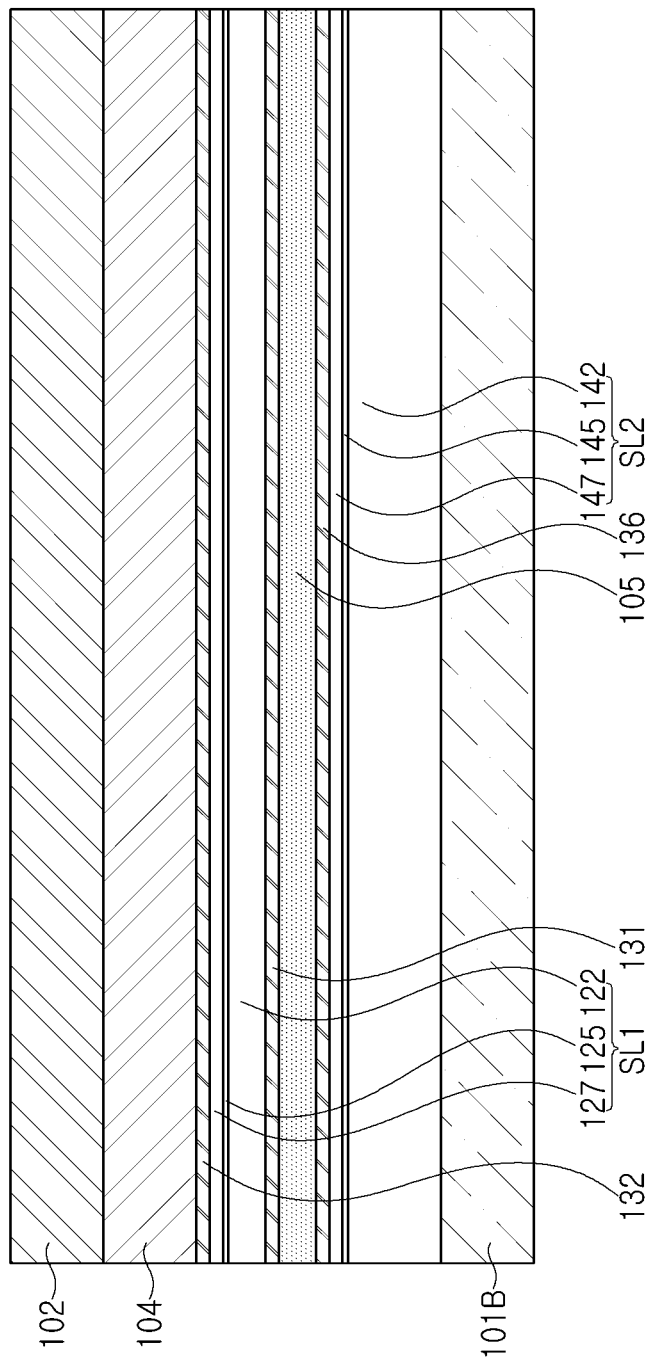

Next, referring to FIG. 8C, a second semiconductor stack SL2 may be formed on a second growth substrate 101B, and the first semiconductor stack SL1 may be bonded onto the second semiconductor stack SL2.

For example, similar to the first growth substrate 101A, the second growth substrate 101B may include an insulating, conductive or semiconductor material such as sapphire, SiC, $MgAl_2O_4$, MgO, $LiAlO_2$, $LiGaO_2$, GaN or the like. The second semiconductor stack SL2 may include a first conductivity-type semiconductor layer 142, an active layer 145, and a second conductivity-type semiconductor layer 147 sequentially formed on the second growth substrate 101B. For example, the second semiconductor stack SL2 may be a nitride semiconductor layer, similar to the semiconductor stack SL1. However, the active layer 145 may be configured to emit light of the second wavelength (e.g., green light).

Figure 9:
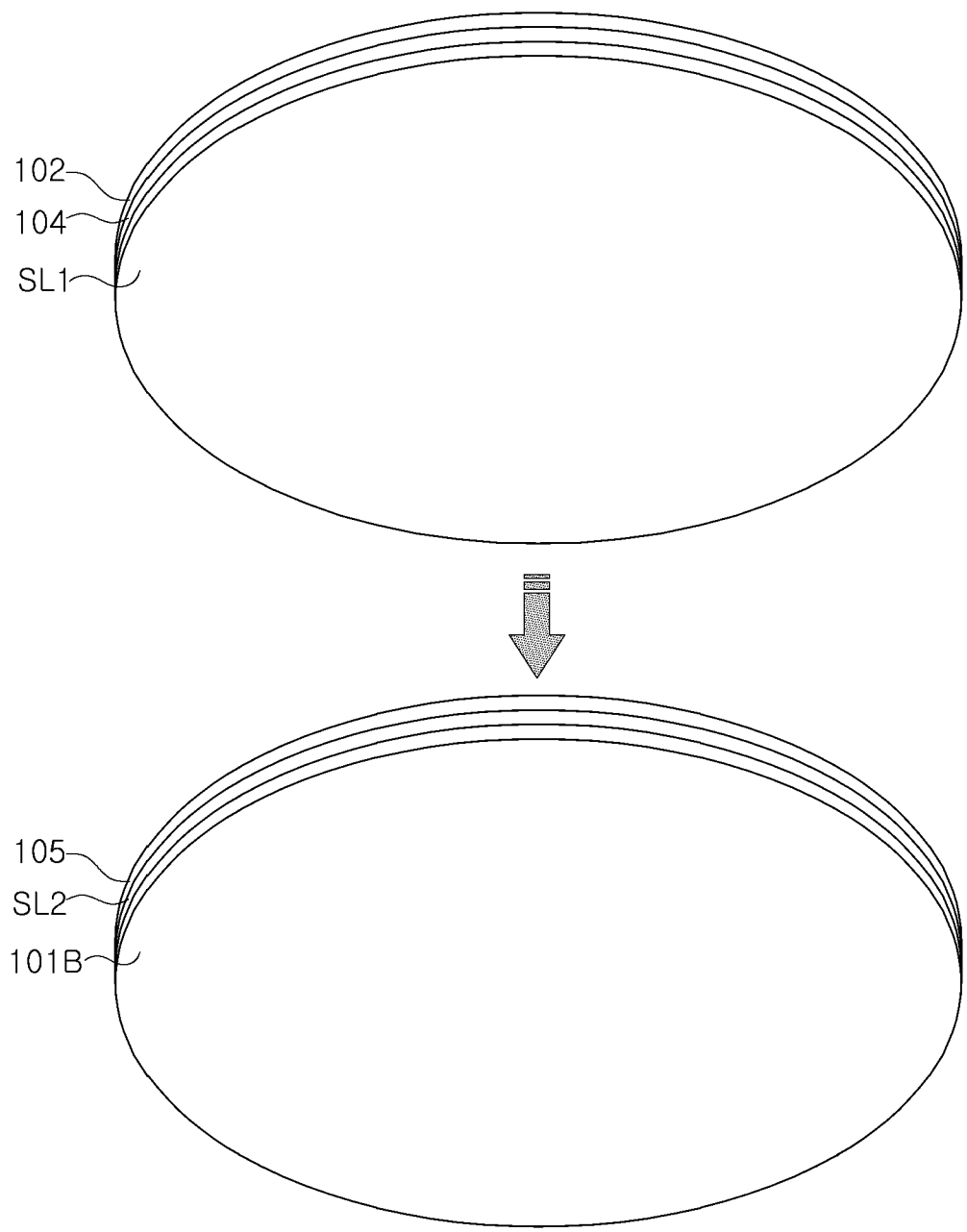
FIG. 9 is a schematic perspective view illustrating a wafer bonding process of FIG. 8C.

A light-transmitting ohmic contact layer 136 may be formed on the second semiconductor stack SL2. The light-transmitting ohmic contact layer 136 may include ITO, ZITO, ZIO, GIO, ZTO, FTO, AZO, GZO, $In_4Sn_3O_{12}$ or $Zn_{(1-x)}Mg_xO$ ($0 \leq x \leq 1$). After depositing a dielectric layer 105 (or inter-cell insulating layer) on the light-transmitting ohmic contact layer 136, the upper surface of the dielectric layer 105 is planarized. The dielectric layer 105 may include at least one of $SiO_2$, SiN, SiCN, SiOC, SiON and SiOCN, for example. Subsequently, fusion bonding is performed on the light-transmitting ohmic contact layer 131 of the first semiconductor stack SL1 on the upper surface of the planarized dielectric layer 105. As illustrated in FIG. 9, a process of bonding the first and second semiconductor stacks SL1 and SL2 may be performed at the wafer level. A hybrid epitaxial bonding structure in which the first and second semiconductor stacks SL1 and SL2 are bonded to each other through a wafer-level bonding process may be provided.

Figure 8D:
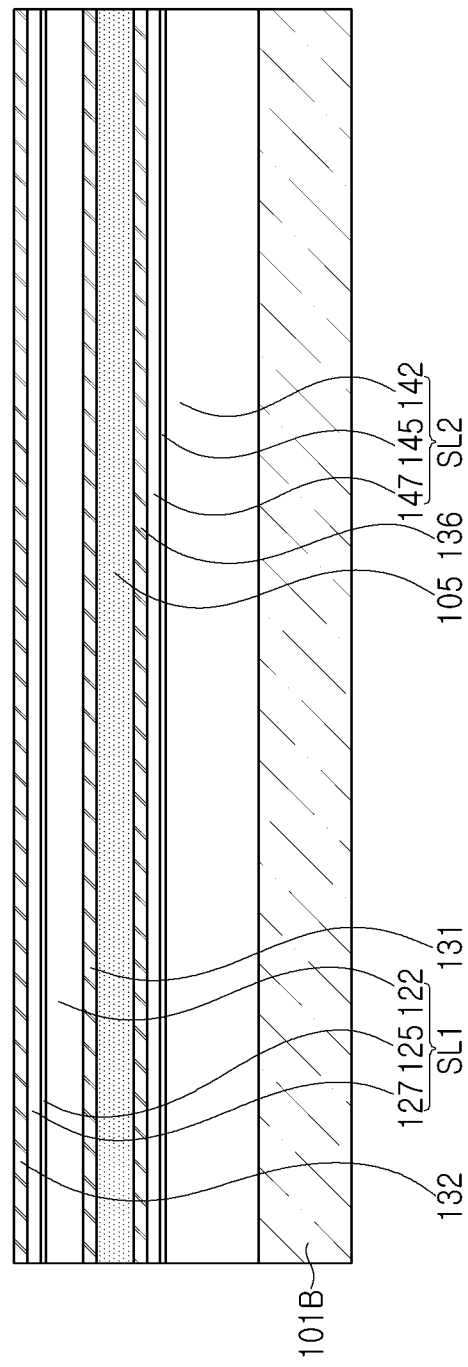

Next, referring to FIG. 8D, the support substrate 102 may be removed from the hybrid epitaxial bonding structure in which the first and second semiconductor stacks SL1 and SL2 are bonded to each other. In the process of removing the support substrate 102, a dielectric layer 104 may be removed together. In another embodiment, a portion of the dielectric layer 104 may remain on the ohmnic contact layer 132.

Accordingly, a pixel array of an LED display apparatus may be manufactured using the hybrid epitaxial bonding structure illustrated in FIG. 8D. In detail, LED cells located on two levels may be manufactured using the first and second semiconductor stacks SL1 and SL2 of the hybrid epitaxial bonding structure. According to this manufacturing process, LED display apparatuses of various structures may be manufactured.

FIGS. 10A to 10H are cross-sectional views illustrating a method of manufacturing an LED display apparatus according to an example embodiment, and FIGS. 11A to 11D are plan views illustrating the processes of FIGS. 10A, 10C, 10D and 10H.

Figure 10A:
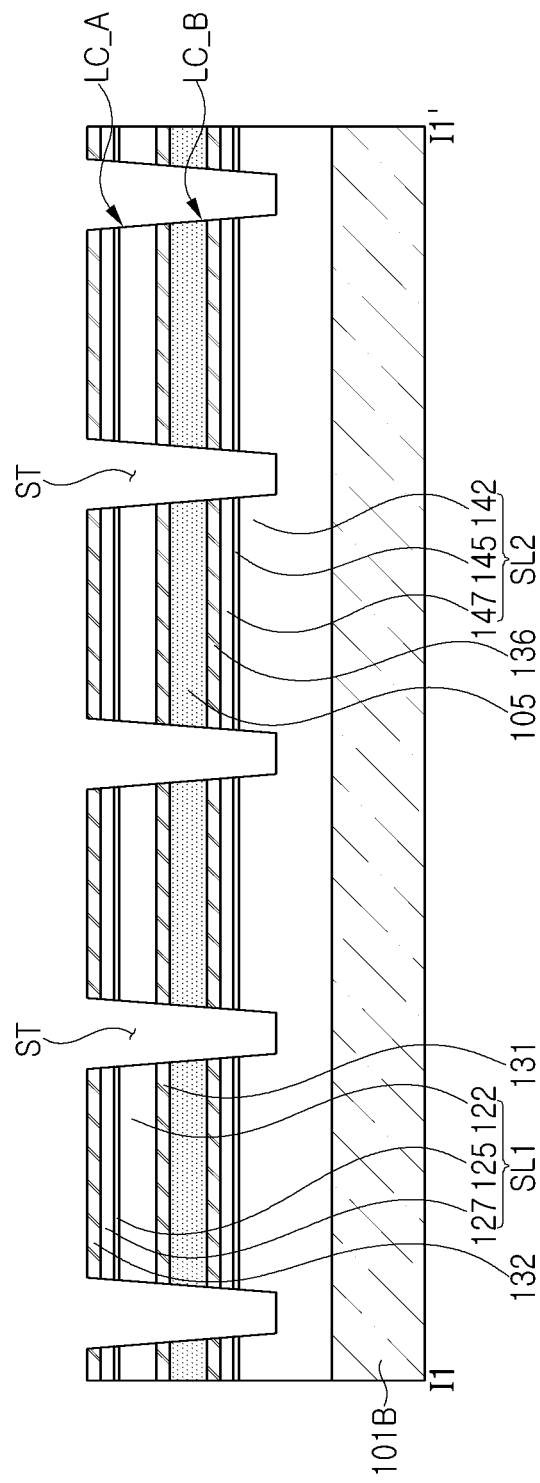
FIGS. 10A to 10H are cross-sectional views illustrating a method of manufacturing an LED display apparatus according to an example embodiment.
Figure 11A:
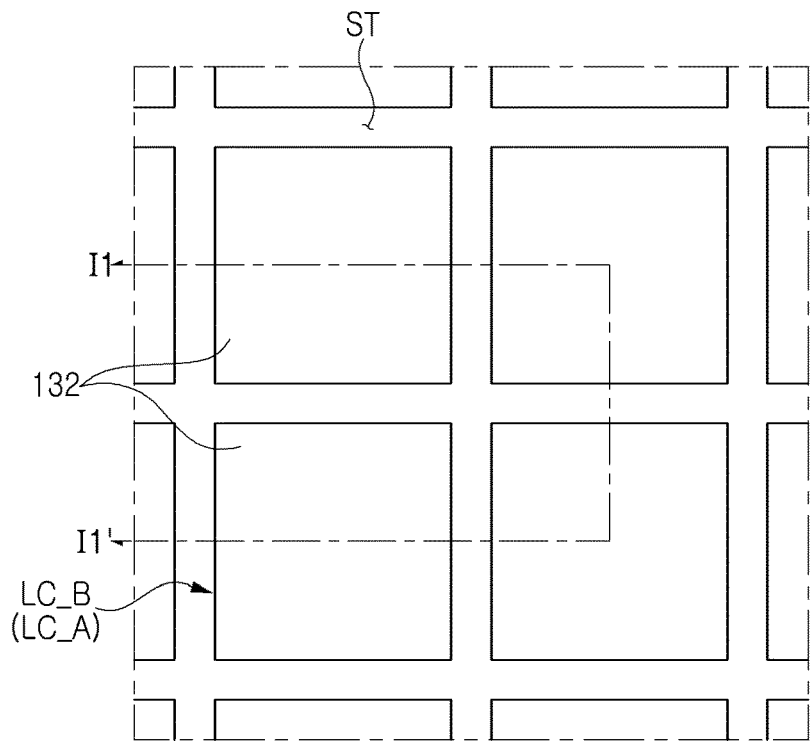
FIGS. 11A to 11D are plan views illustrating a method of manufacturing an LED display apparatus according to an example embodiment.

Referring to FIGS. 10A and 11A, an etching process may be performed in such a manner that the hybrid epitaxial bonding structure is divided into sub-pixel areas.

A first LED cell LC_A and a second LED cell LC_B are disposed in each sub-pixel area. The first LED cell LC_A and the second LED cell LC_B may be divided by a trench ST provided at a predetermined interval. The first LED cell LC_A and the second LED cell LC_B may be coupled by an inter-cell insulating layer 105 formed from a dielectric layer. The sub-pixel areas formed by this etching process may be arranged in a lattice shape in a quadrangular shape, as illustrated in FIG. 11A. The first LED cell LC_A is also referred to as "lower LED cell", and the second LED cell LC_B is also referred to as "upper LED cell" (see FIGS. 3, 6 and 7).

The trench ST is provided to separate the first semiconductor stack SL1 into the first LED cells LC_A and to partially divide the second semiconductor stack SL2 to provide the second LED cell LC_B. At least the active layer 145 in the second semiconductor stack SL2 may be divided by the trench ST. The trench ST in this embodiment may be formed to have a sufficient depth to form the light blocking partition 150 illustrated in FIG. 3. In addition, the trench ST may have a cross-sectional shape having an upper end width greater than a lower end width.

Figure 10B:
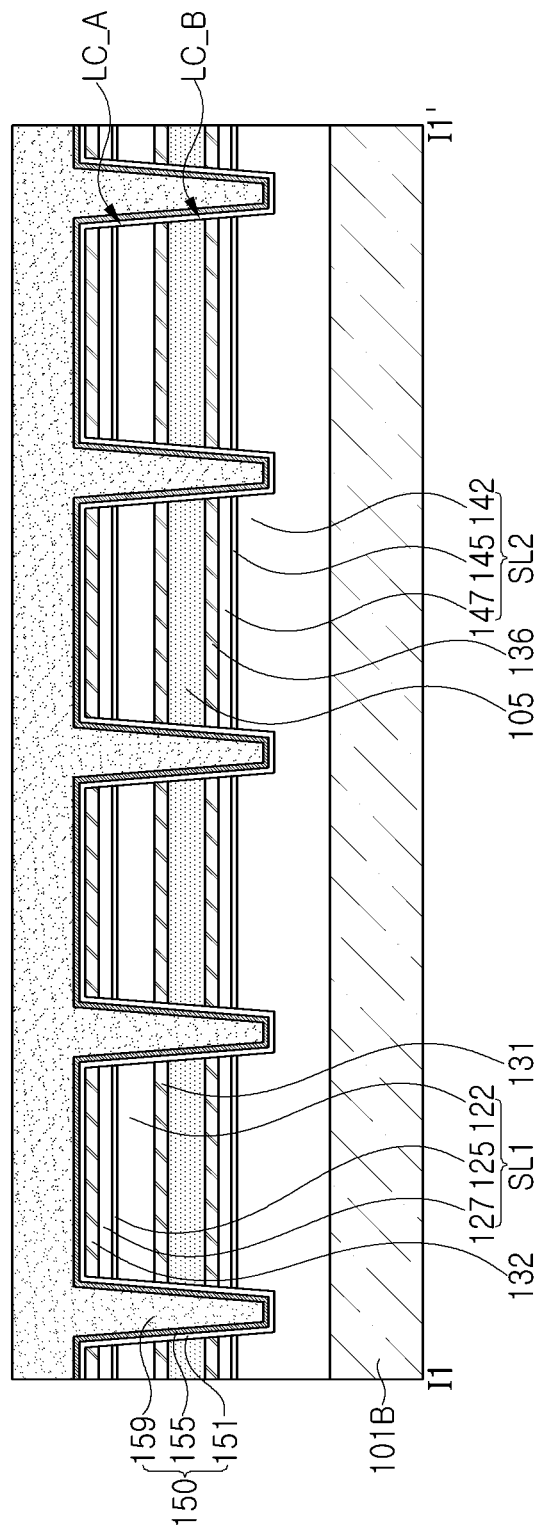

Next, referring to FIG. 10B, an insulating film 151, a reflective layer 155, and a filling insulating structure 159 may be sequentially formed to fill the trench ST.

To prevent unwanted connection between the reflective layer 155 and the first and second semiconductor stacks SL1 and SL2, the insulating film 151 may be formed before the reflective layer 155 is formed. For example, the insulating film 151 may include at least one of SiO$_2$, SiN, SiCN, SiOC, SiON and SiOCN. The insulating film 151 may be formed relatively conformally. For example, the reflective layer 155 may include a reflective metal such as Ag, Ni or Al. The filling insulating structure 159 may include a silicon oxide or a silicon oxide-based insulating material. In some embodiments, the reflective layer may be implemented as a distributed Bragg reflective (DBR) layer or an omni-directional reflective (ODR) layer. When introducing the DBR layer as the reflective layer 155, the insulating film 151 may be omitted.

Figure 10C:
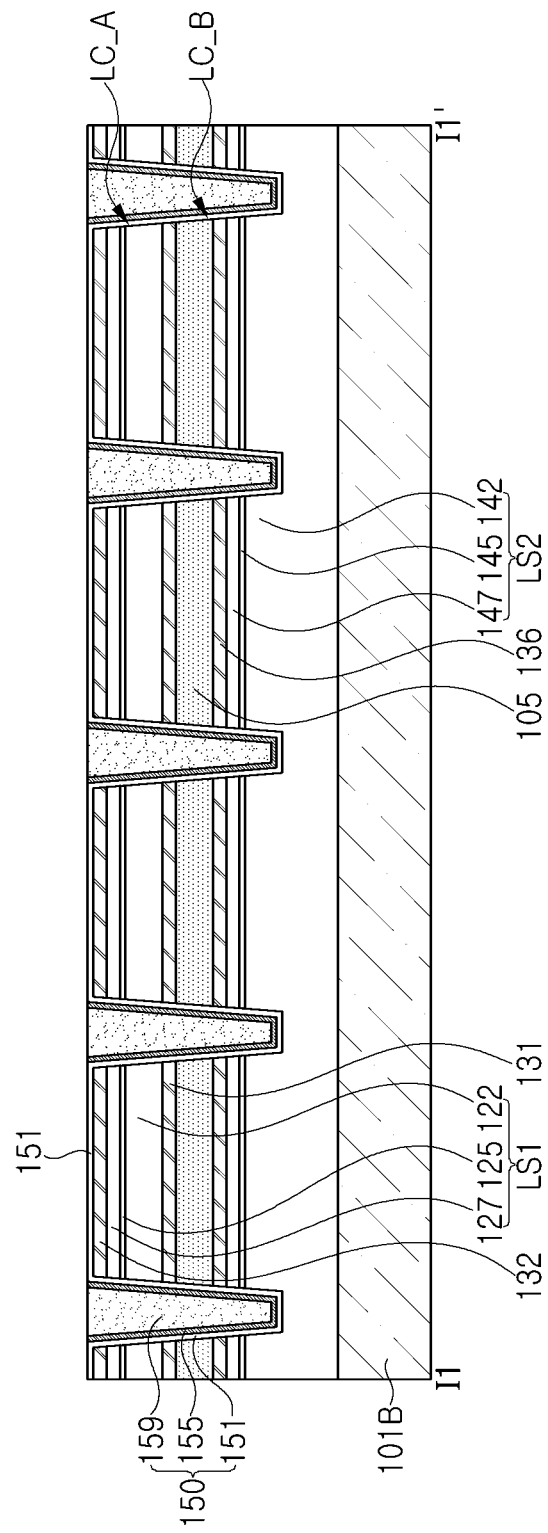
Figure 11B:
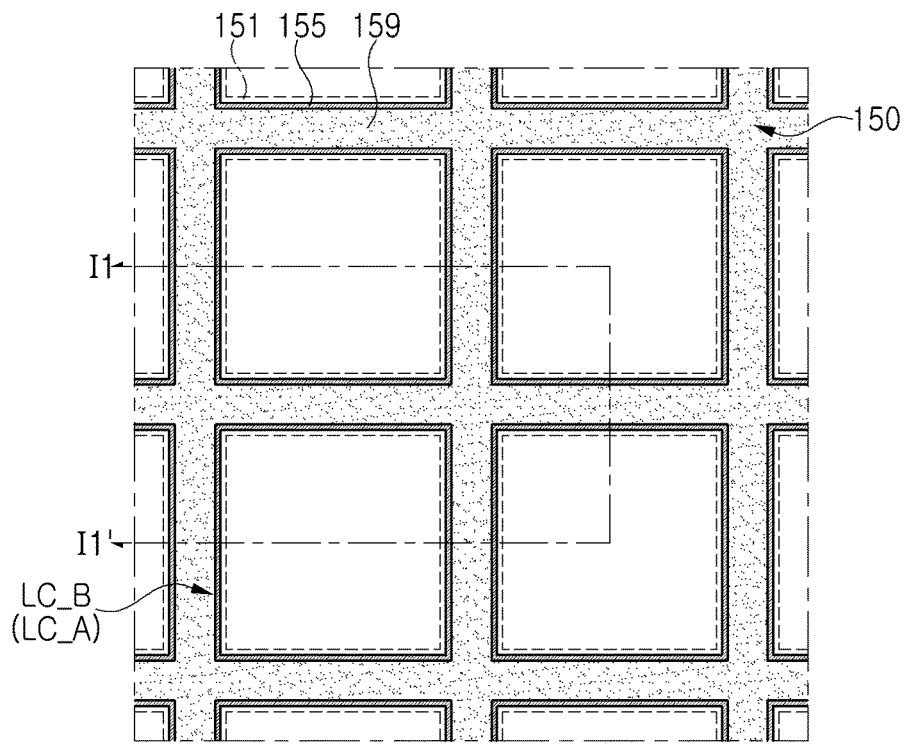

Next, referring to FIGS. 10C and 11B, a planarization process may be performed to remove portions of the filling insulating structure 159 and the reflective layer 155 positioned on the first semiconductor stack SL1. Through this planarization process, the light blocking partition 150 located in the trench ST may be provided. The reflective layer 155 located on the upper surface of the first semiconductor stack SL1 may be removed, and the insulating film 151 may remain on the upper surface of the first semiconductor stack SL1.

Figure 10D:
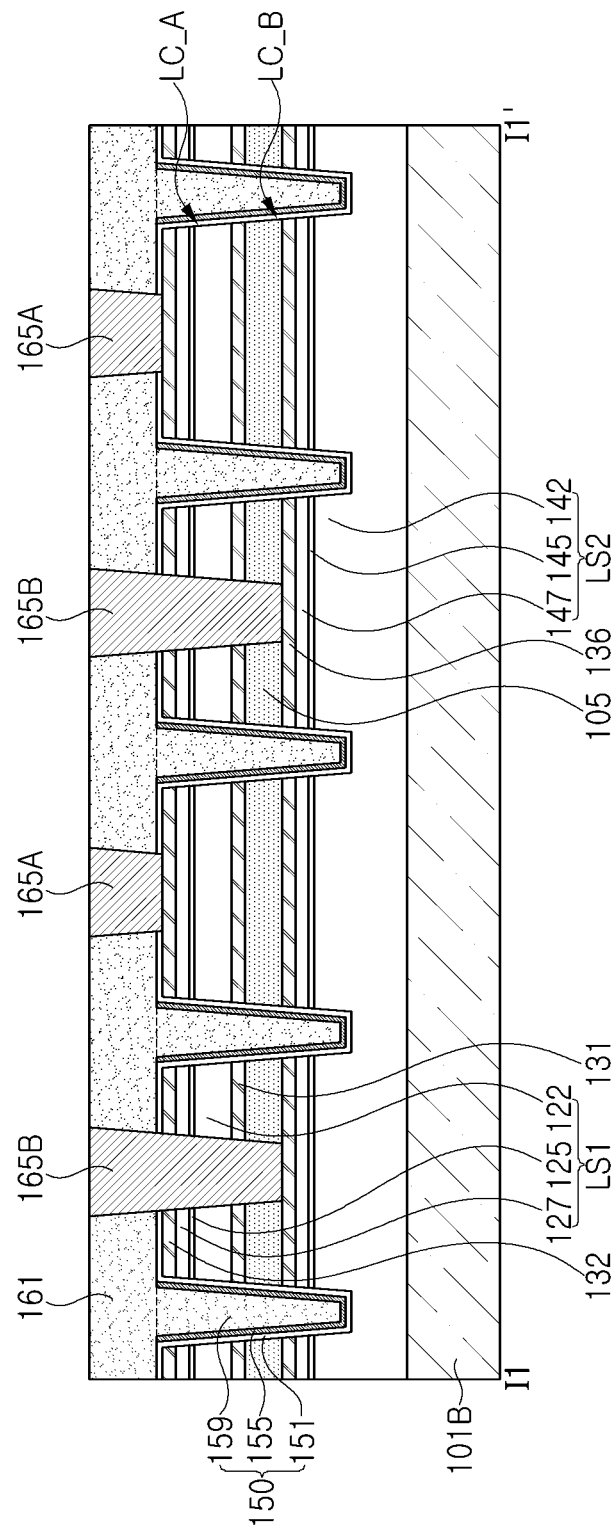
Figure 11C:
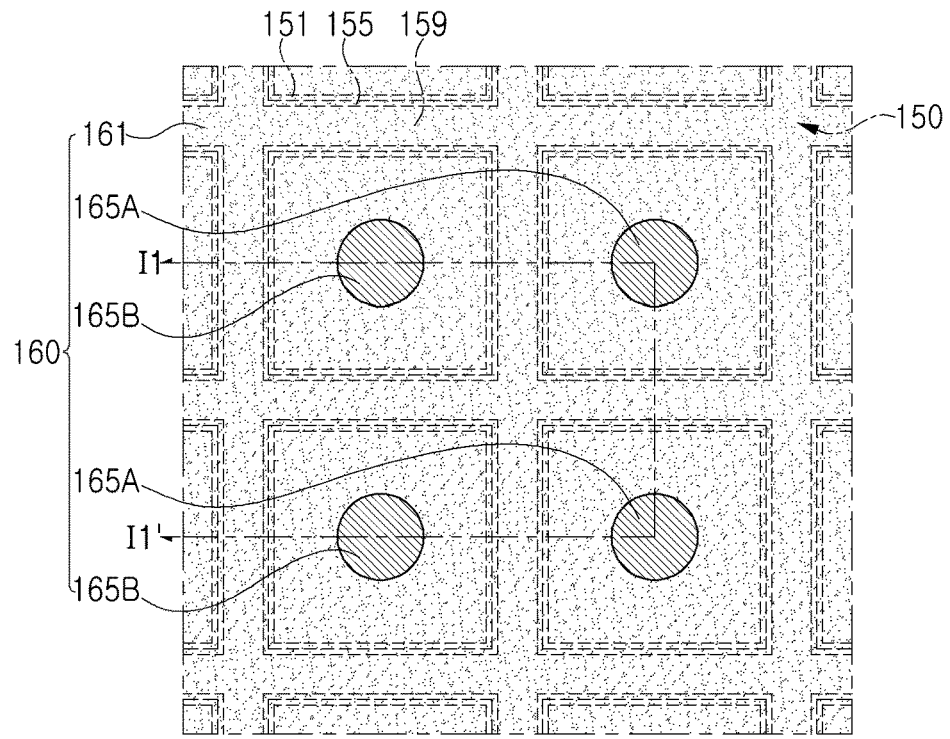

Next, referring to FIGS. 10D and 11C, a wiring insulating layer 161 may be formed on the first semiconductor stack SL1, and first and second via electrodes 165A and 165B may be formed.

The wiring insulating layer 161 may be formed of a low dielectric material such as silicon oxide. The first via electrode 165A may be formed to be connected to the ohmic contact layer 132 of the first LED cell LC_A. The second via electrode 165B may be formed to penetrate through the first LED cell LC_A and the inter-cell insulating layer 105 to be connected to the ohmic contact layer 136 of the second LED cell LC_B. The first LED cell LC_A through which the second via electrode 165B penetrates does not emit light. In a final structure, the first via electrodes 165A may be provided as the first individual electrode and the third individual electrode, and the second via electrode 165B is provided as a second individual electrode, as described above.

For example, the first and second via electrodes 165A and 165B may include copper or a copper-containing alloy, and may be formed using a dual-damascene process.

Figure 10E:
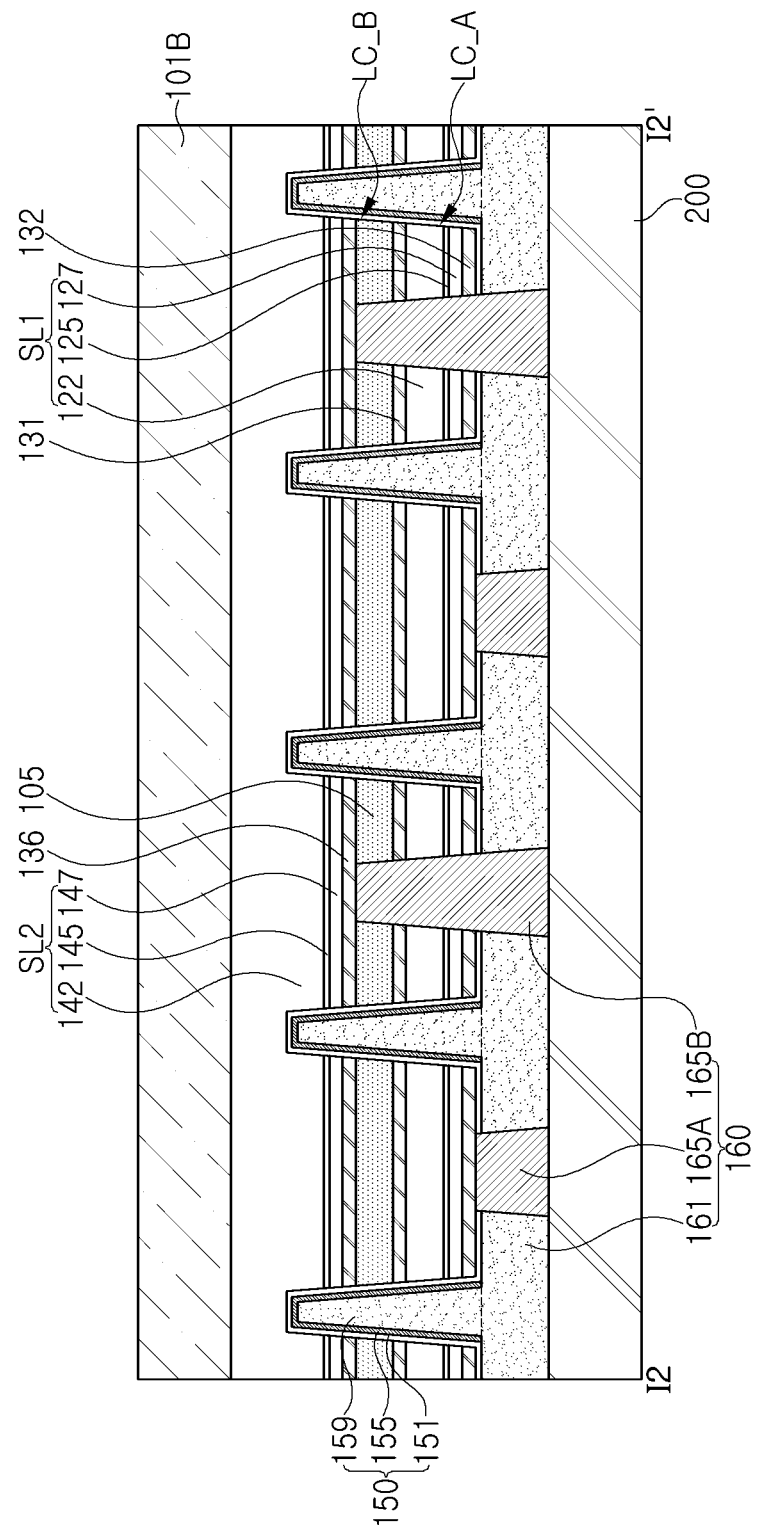

Next, referring to FIG. 10E, the resultant of FIG. 10D may be bonded to the circuit board 200 in such a manner that the first and second via electrodes 165A and 165B are respectively connected to the driving circuit.

Figure 12:
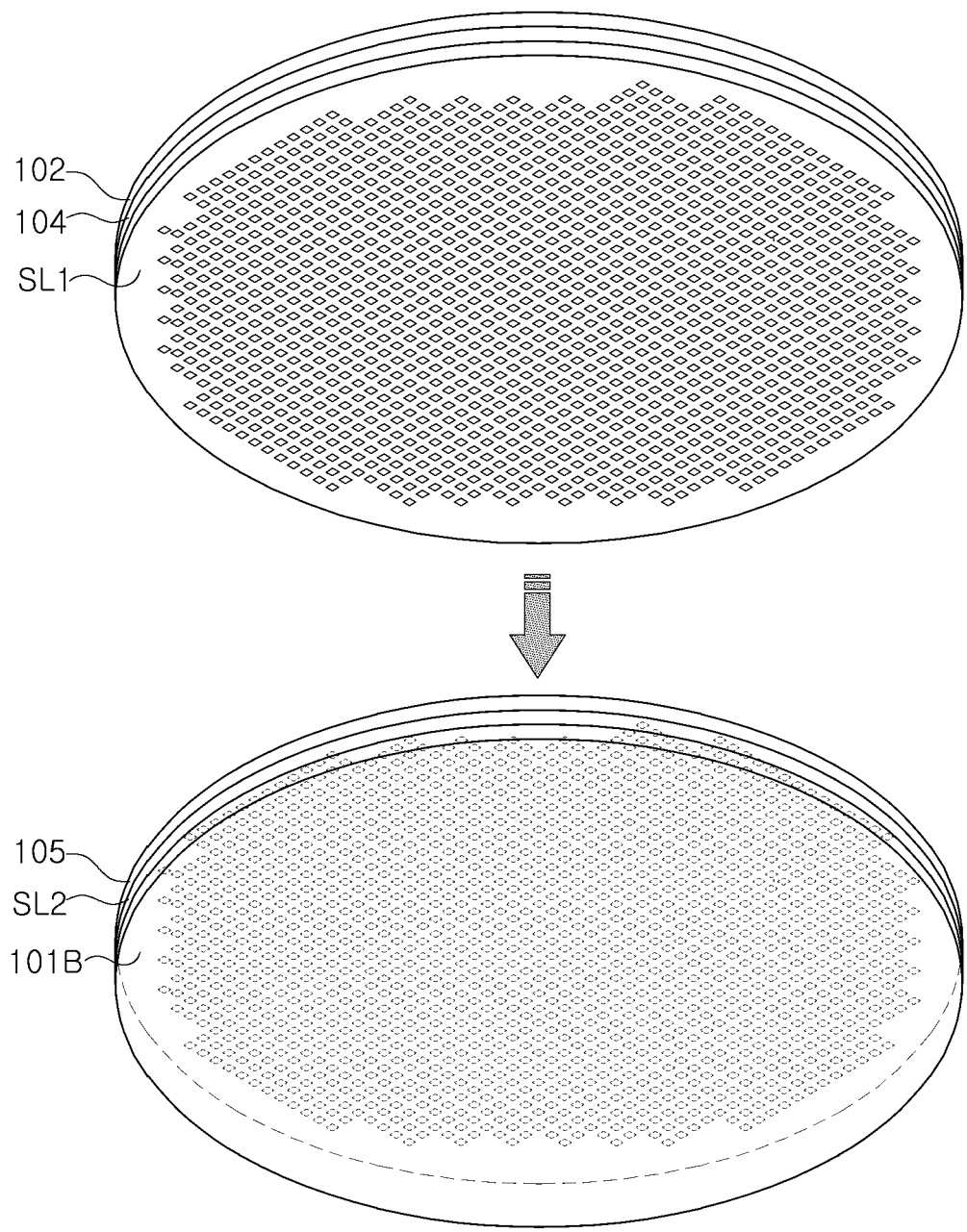
FIG. 12 is a schematic perspective view illustrating a wafer bonding process of FIG. 10E.

In this embodiment, a detailed configuration of the circuit board is omitted for convenience of description, but may be understood with reference to the configuration of the circuit board described with respect to FIG. 3. The circuit board and the resultant product (intermediate product of the pixel array) of FIG. 10D may be integrally bonded by a wafer bonding method such as hybrid bonding. For example, the flat surface of a dielectric layer 281 may be bonded to the flat surface of the wiring layer 160, and a bonding pad 285P may be bonded to the first and second via electrodes 165A and 165B, respectively (See FIG. 3). Although not illustrated, a via electrode (refer to 165C in FIG. 4) for the common electrode may be similarly bonded to the bonding pad 285P. This bonding process may be performed at the wafer level, as illustrated in FIG. 12.

Figure 10F:
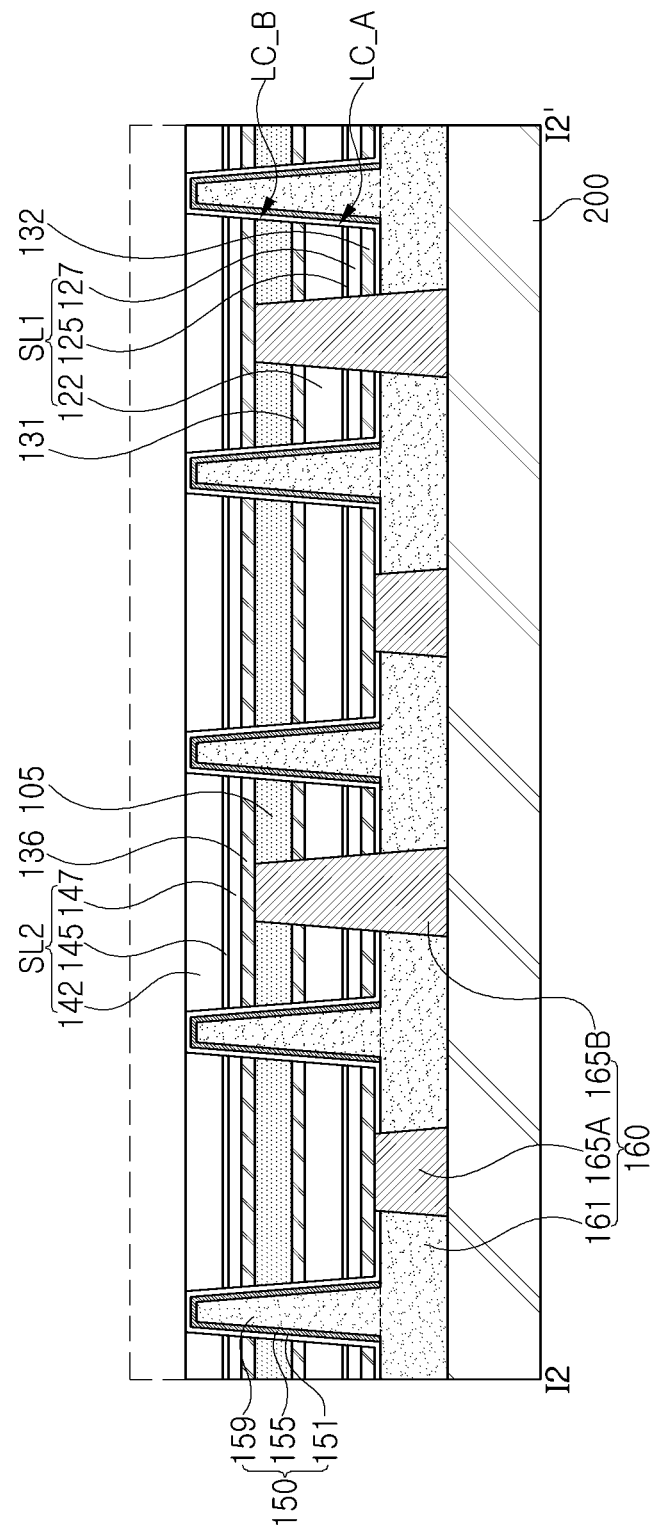

Next, referring to FIG. 10F, the second growth substrate 101B may be removed from the second semiconductor stack SL2, and the thickness of the second semiconductor stack SL2 may be reduced.

The thickness of the second semiconductor stack SL2 may be reduced by using a polishing process such as chemical mechanical planarization (CMP) on the second semiconductor stack SL2. This polishing process may be performed until the light blocking partition 150 is exposed. The insulating film 151 of the light blocking partition 150 may be exposed by this process.

Figure 10G:
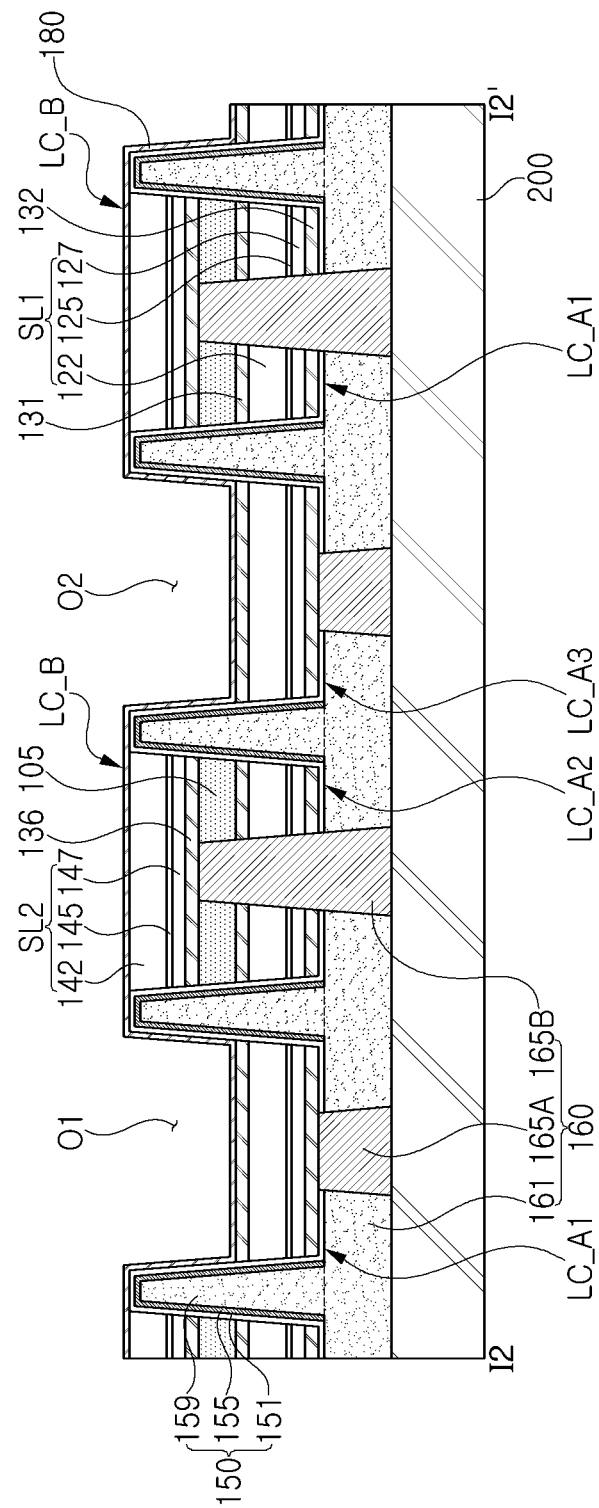

Next, referring to FIG. 10G, upper LED cells are selectively removed to expose first and third lower LED cells LC_A1 and LC_A3 in blue and red sub-pixel areas, thereby forming first and second open areas O1 and O2.

This selective removal process may also remove the inter-cell insulating layer 105 along with the upper LED cells in the blue and red sub-pixel areas, such that the light-transmitting ohmic contact layer 131 of the lower LED cells LC_A1 and LC_A3 may be exposed. Then, an electrode layer (or transparent electrode layer) 180 may be formed on the exposed surface of the light-transmitting ohmic contact layer 131 of the first and second semiconductor stacks SL1 and SL2 and the surface of the first conductivity-type semiconductor layer 147 of the remaining upper LED cell LC_B. The first and second open areas O1 and O2 may be located in a level area (or a second level area) corresponding to the remaining upper LED cell LC_B and the inter-cell insulating layer 105.

Figure 10H:
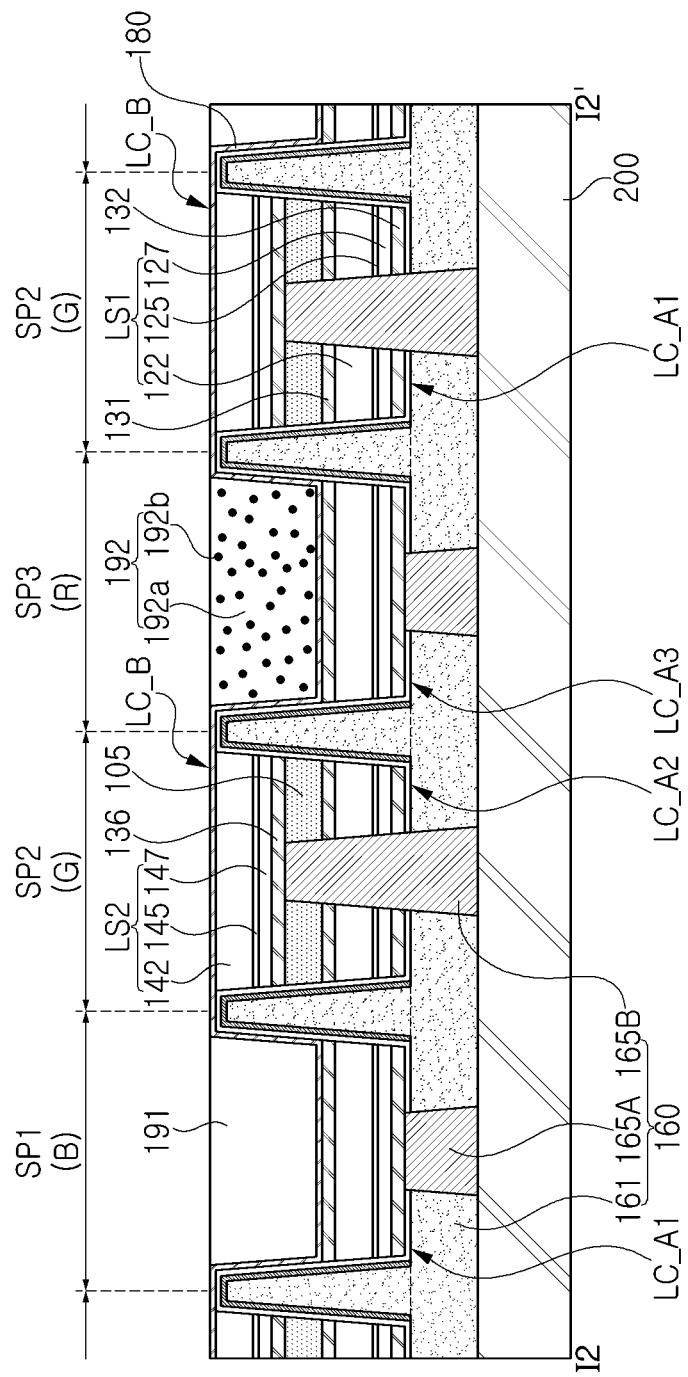
Figure 11D:
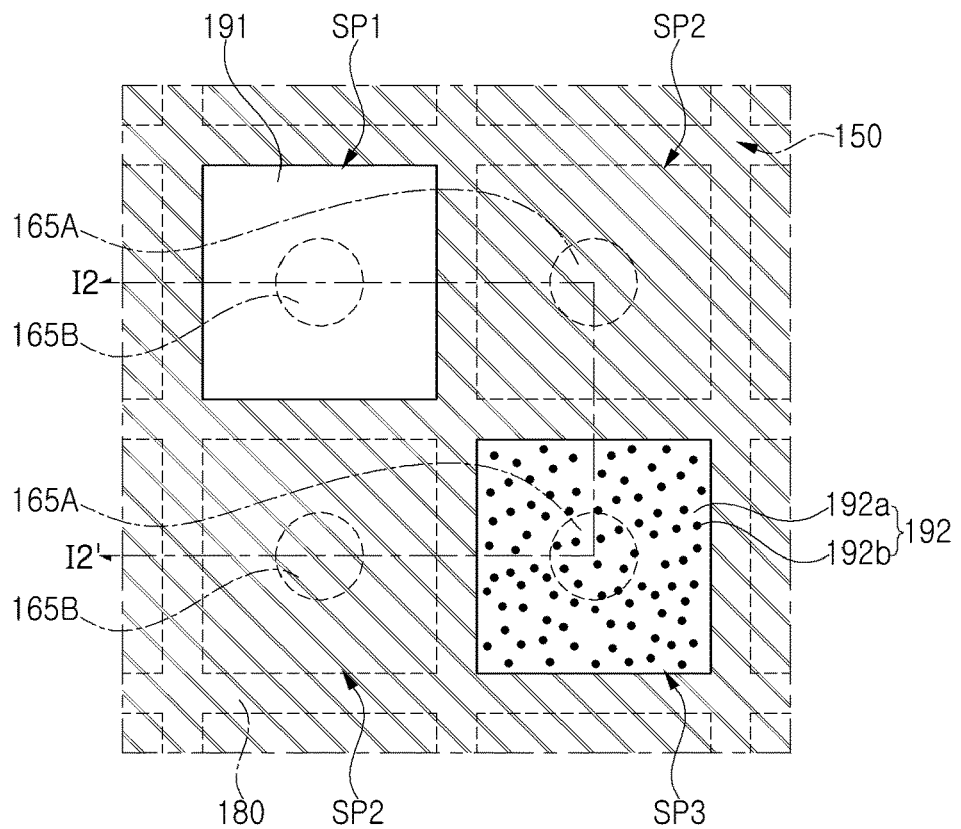

Next, referring to FIGS. 10H and 11D, a transparent resin structure 191 and a wavelength conversion structure 192 may be formed, respectively, in the first open area O1 and the second open area O2.

The transparent resin structure 191 is formed in the first open area O1 for the blue sub-pixel SP1, and the wavelength conversion structure 192 is formed in the second open area O2 for the red sub-pixel SP3. For example, the transparent resin structure 191 may be formed of a transparent resin such as a silicone resin or an epoxy resin, or a silicon oxide such as SiO$_2$. The wavelength conversion structure 192 may be formed of a transparent resin 192b mixed with a wavelength conversion material 192a converting blue light into red light. In the blue sub-pixel SP1, the blue light B generated from the first lower LED cell LC_A1 is emitted through the transparent resin structure 191 as is, and in the red sub-pixel SP3, the blue light generated from the third lower LED cell LC_A3 may be converted into red light R through the wavelength conversion structure 192 and then emitted as red light R. On the other hand, in the green sub-pixel SP2, green light may be emitted from the upper LED cell LC_B. During this driving process, the second lower LED cell LC_A2 may not emit light as an inactive LED cell.

FIGS. 13A to 13D are cross-sectional views illustrating a method of manufacturing an LED display apparatus according to an example embodiment. This manufacturing process may be understood as a manufacturing process of the LED display apparatus 10A illustrated in FIG. 6.

Figure 13A:
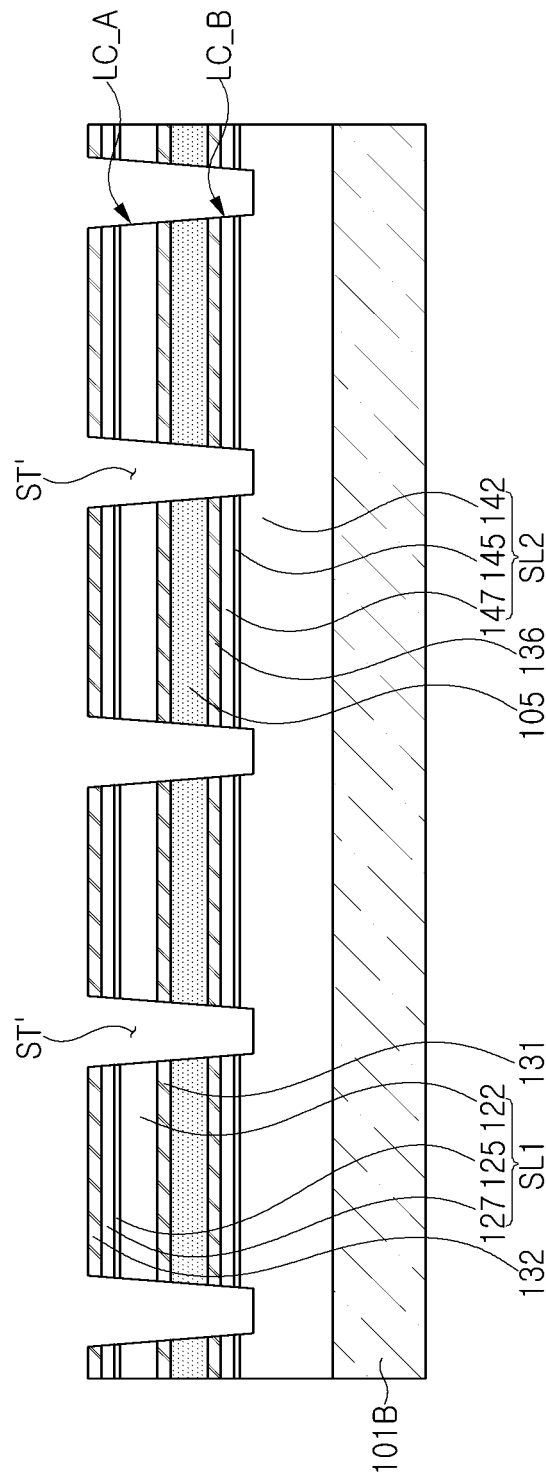
FIGS. 13A to 13D are cross-sectional views illustrating a method of manufacturing an LED display apparatus according to an example embodiment.

Referring to FIG. 13A, a trench for dividing the hybrid epitaxial bonding structure into sub-pixel areas may be formed.

Similar to the process illustrated in FIG. 10A, trenches ST' for forming the first LED cell LC_A and the second LED cell LC_B may be formed in a grid shape. The trench ST' in this embodiment has a depth that is less than that of the trench ST described in the one or more embodiments described above with respect to FIGS. 3 and 4.

Figure 13B:
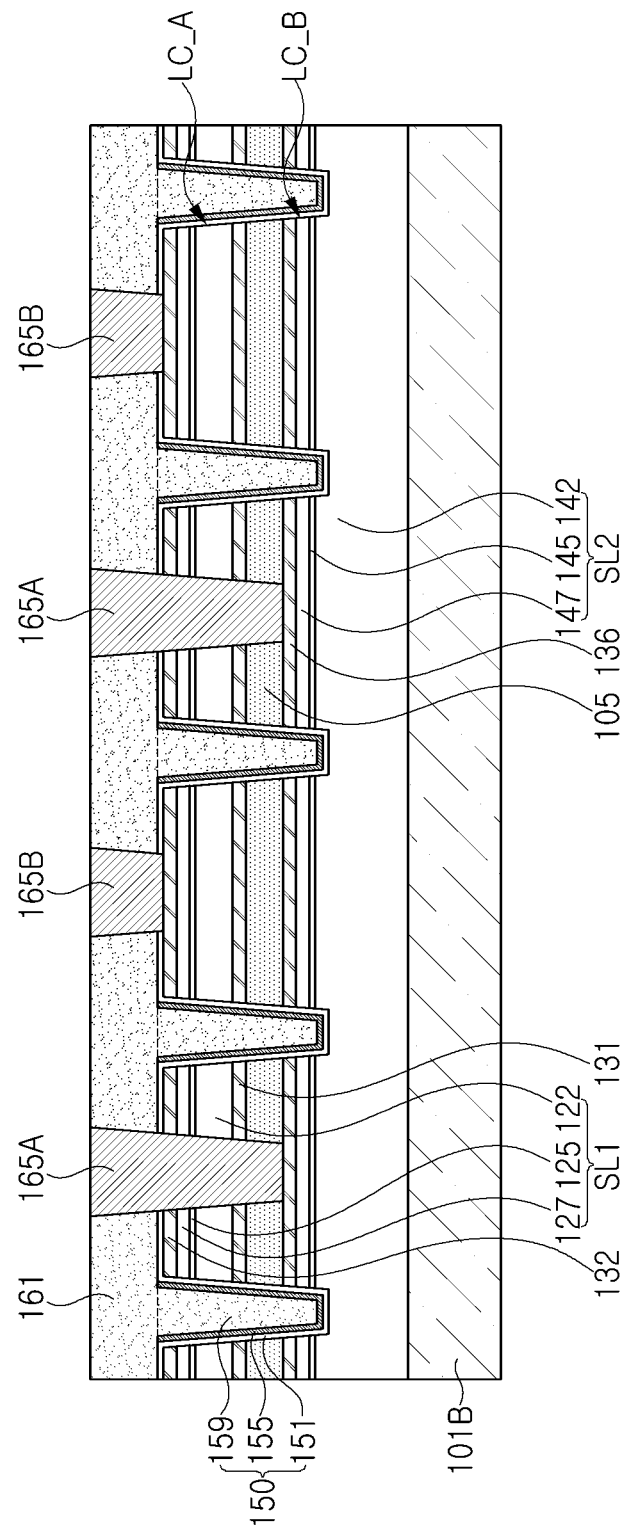

Next, referring to FIG. 13B, an insulating film 151, a reflective layer 155, and a filling insulating structure 159 may be sequentially formed to fill the trench ST'. Subsequently, a planarization process of removing portions of the filling insulating structure 159 and the reflective layer 155 positioned on the first semiconductor stack SL1 may be performed to provide a light blocking partition 150A. Additionally, a wiring insulating layer 161 may be formed on the first semiconductor stack SL1, and first and second via electrodes 165A and 165B may be formed using a dual damascene process.

Figure 13C:
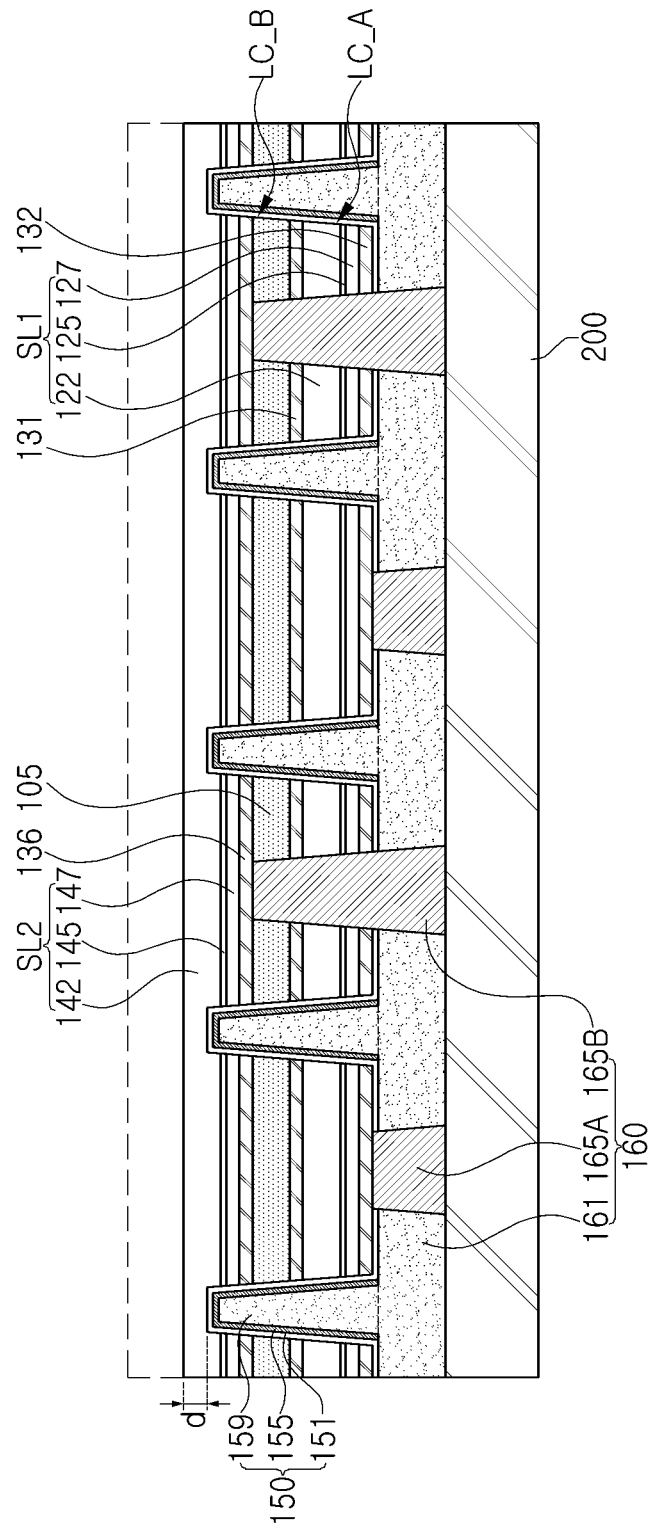

Next, referring to FIG. 13C, the resultant of FIG. 13B may be bonded to the circuit board 200 such that the first and second via electrodes 165A and 165B are respectively connected to the driving circuit of the circuit board 200. This bonding process may be performed by a wafer bonding method such as hybrid bonding similar to the embodiments described above. Subsequently, a second growth substrate 101B may be removed from the second semiconductor stack SL2 and the thickness of the second semiconductor stack SL2 may be reduced.

In this embodiment, unlike the one or more embodiments described above, the polishing process for the second semiconductor stack SL2 may be performed such that the light blocking partition 150A is not exposed. Even after the polishing process, the first conductivity-type semiconductor layer 142 having a predetermined thickness d may remain on the light blocking partition 150A.

Figure 13D:
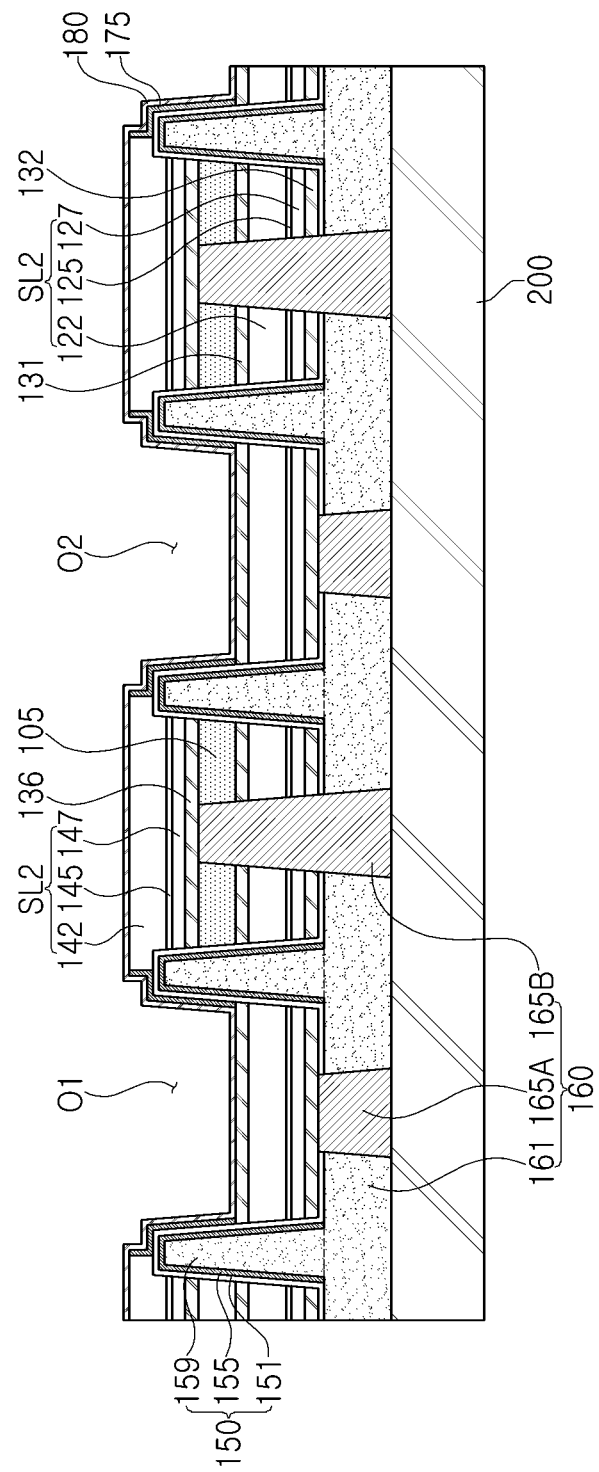

Subsequently, referring to FIG. 13D, the upper LED cell are selectively removed such that the first and third lower LED cells LC_A1 and LC_A3 are exposed in the blue and red sub-pixel areas to form first and second open areas O1 and O2. In addition, before forming a transparent electrode layer 180, a side reflective layer 175 may formed. The side reflective layer 175 is introduced to prevent optical interference between the sub-pixels SP1, SP2 and SP3. The side reflective layer 175 is disposed on a side area of the upper LED cell LC_B that is formed at a location higher than the upper end of the light blocking partition 150A, and may extend to the side area of the light blocking partition 150A exposed by the first and second open areas O1 and O2. The side reflective layer 175 may be removed to remain only in the side areas of the upper LED cell LC_B and the light blocking partition 150A by selective etching or anisotropic etching after forming a conformal reflective metal layer over the entire area. Then, a common electrode layer (or transparent electrode layer) 180 is formed on the exposed surface of a light-transmitting ohmic contact layer 131 of the first and second semiconductor stacks SL1 and SL2 and the surface of a first conductivity-type semiconductor layer 147 of the remaining upper LED cell LC_B.

Subsequently, a transparent resin structure 191 is formed in the first open area O1 for the blue sub-pixel SP1, and a wavelength conversion structure 192 is formed in the second open area O2 for the red sub-pixel SP3 (see FIG. 10H), thereby manufacturing the display apparatus illustrated in FIG. 6.

Figure 14A:
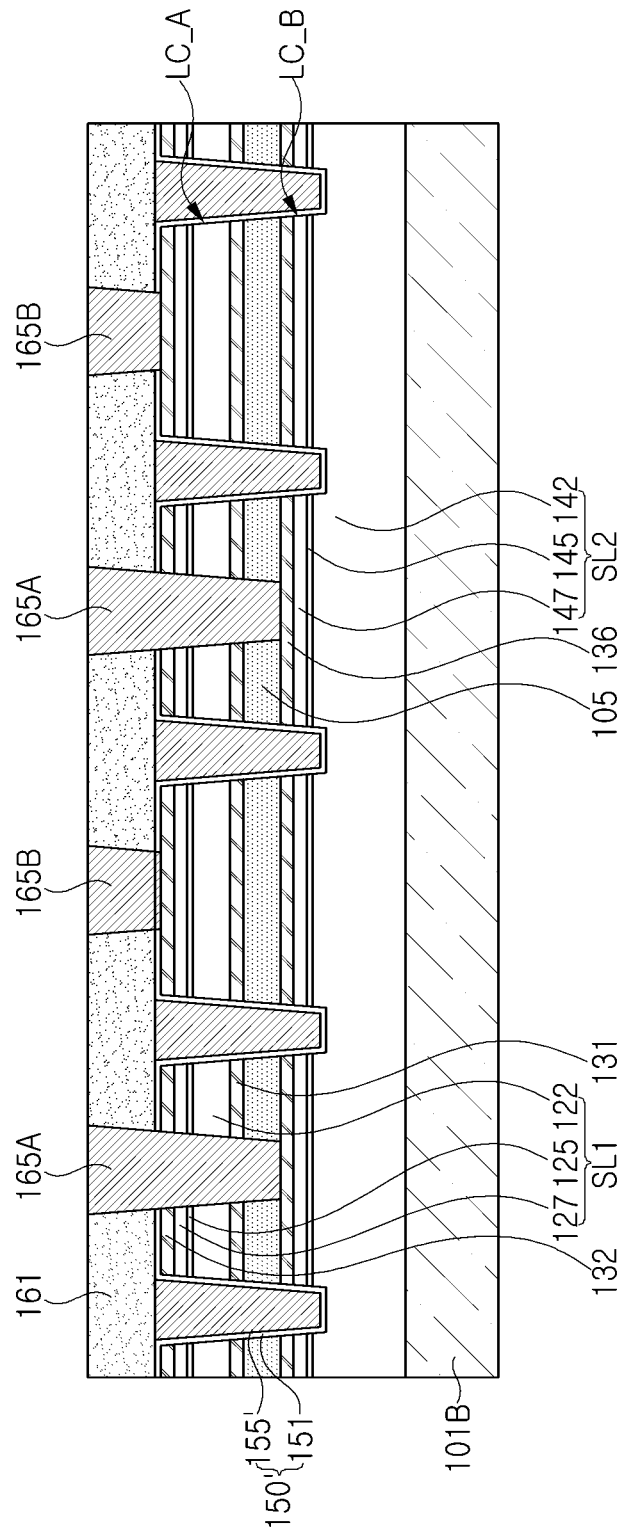
FIGS. 14A to 14C are cross-sectional views illustrating a method of manufacturing an LED display apparatus according to an example embodiment.
Figure 14B:
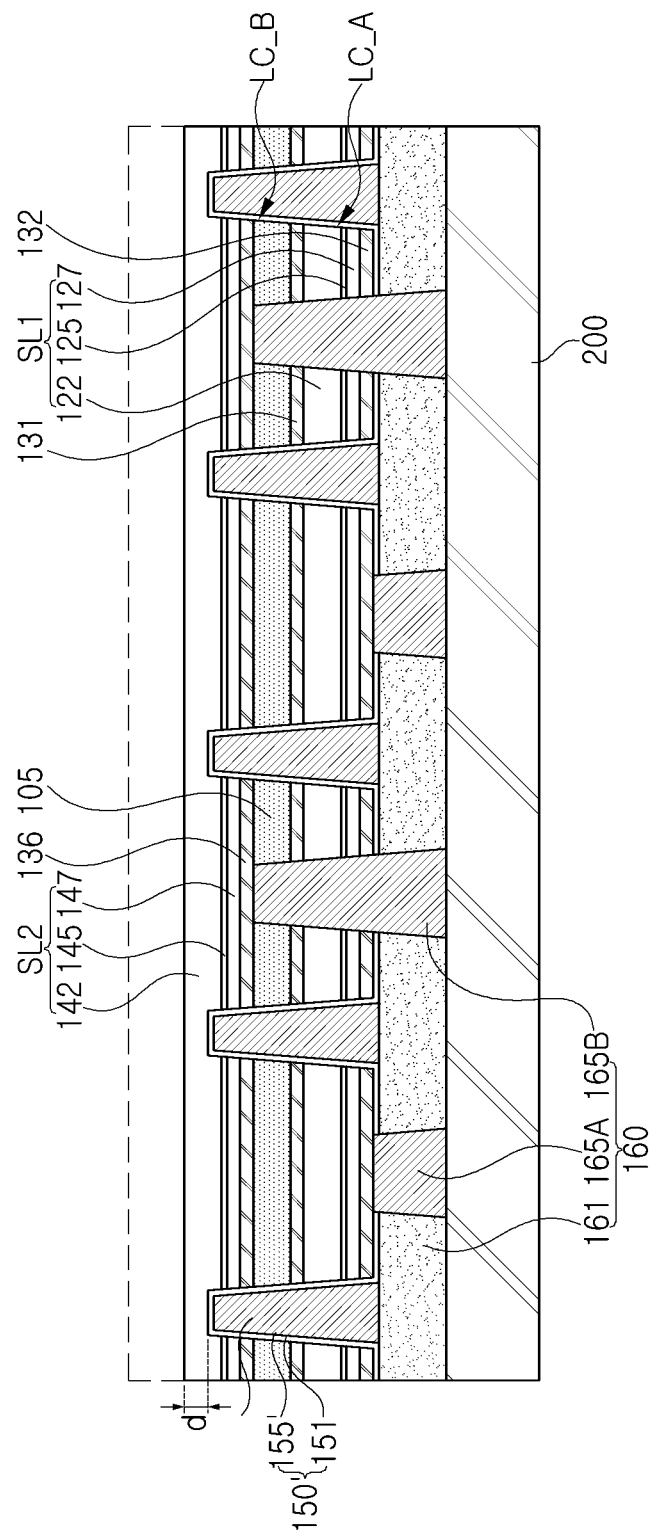
Figure 14C:
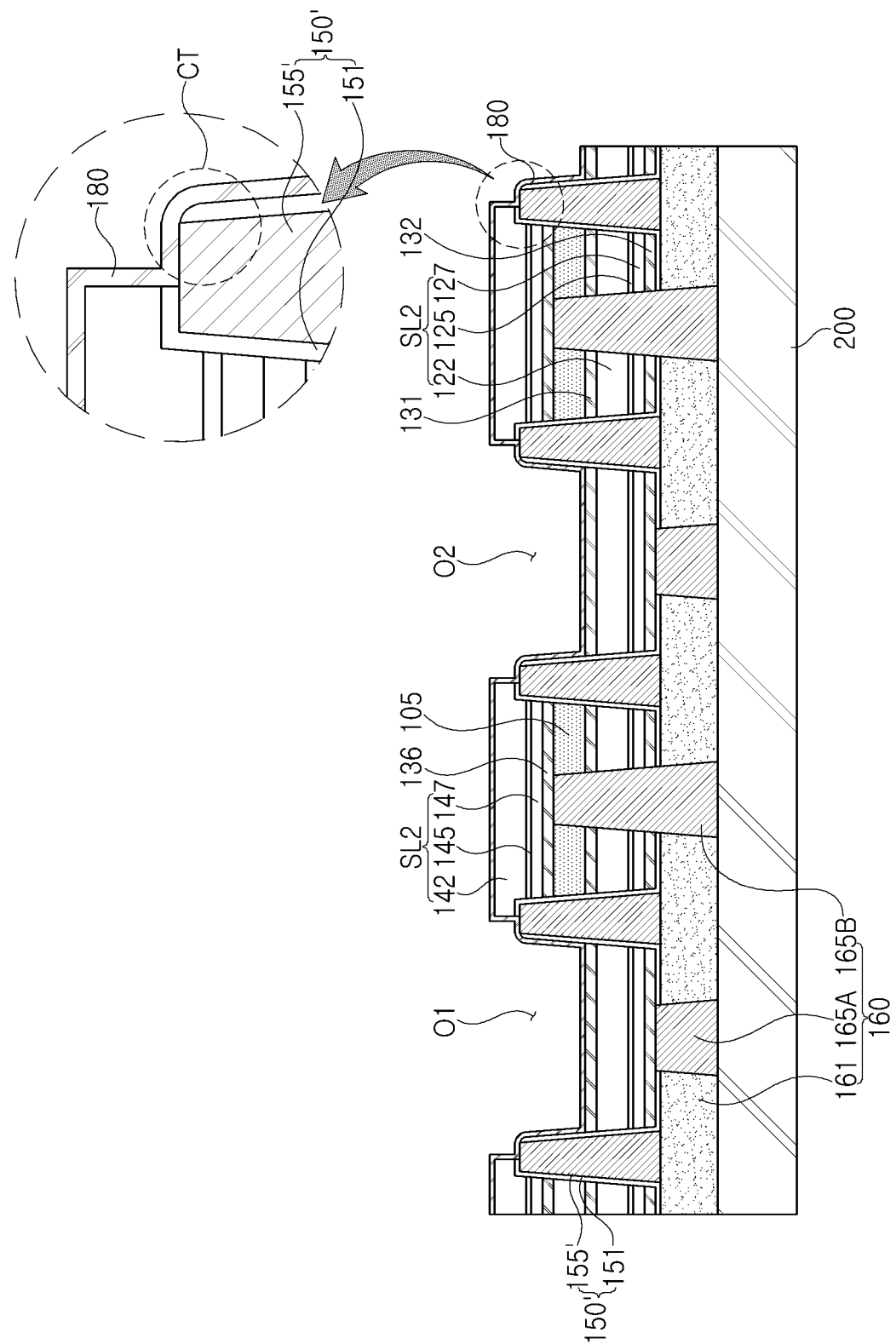

FIGS. 14A to 14C are cross-sectional views illustrating a method of manufacturing an LED display apparatus according to an example embodiment. This manufacturing process may be understood as a process similar to that of the method of manufacturing the LED display apparatus illustrated in FIGS. 13A to 13D, except that a different type of light blocking partition is provided and a portion of the light blocking partition is connected to the transparent electrode layer 180 to form a portion of the common electrode.

Referring to FIG. 14A, an insulating film 151 is conformally formed in the trench ST', and the interior of the trench ST' may be filled with a metallic material to form a filling metal portion 155', in place of the reflective layer 155 and the filling insulating structure 159.

The filling metal portion 155' may be formed by depositing a filling metal material inside of the trench and on the first semiconductor stack SL1 and then performing a planarization process to remove a portion located on the first semiconductor stack SL1. As described above, the light blocking partition 150' according to this embodiment may include the insulating film 151 and the filling metal portion 155', and light may be effectively blocked between sub-pixels by the filling metal portion 155'.

Additionally, a wiring insulating layer 161 may be formed on the first semiconductor stack SL1, and first and second via electrodes 165A and 165B may be formed using a dual damascene process.

Next, referring to FIG. 14B, the resultant of FIG. 13B may be bonded to the circuit board 200 in such a manner that the first and second via electrodes 165A and 165B are respectively connected to the driving circuit of the circuit board 200. This bonding process may be performed by a wafer bonding method such as hybrid bonding similar to the one or more embodiments described above. Subsequently, the second growth substrate 101B may be removed from the second semiconductor stack SL2, and the thickness of the second semiconductor stack SL2 may be reduced. In this embodiment, the polishing process for the second semiconductor stack SL2 may be performed such that the light blocking partition 150' is not exposed. After the polishing process, the first conductivity-type semiconductor layer 142 having a predetermined thickness d may be formed on the light blocking partition 150A.

Subsequently, referring to FIG. 14C, the upper LED cells may be selectively removed such that the first and third lower LED cells LC_A1 and LC_A3 are exposed in the blue and red sub-pixel areas, to form the first and second open areas O1 and O2. In addition, before forming the transparent electrode layer 180, the insulating film 151 may be partially removed to expose a partial region of the filling metal portion 155'. In this embodiment, a portion of the insulating film 151 located on the exposed upper surface of the light blocking partition 150' may be removed. For example, this removal process may be performed by an anisotropic etching process. Next, on the exposed surface of a light-transmitting ohmic contact layer 131 of the first and second semiconductor stacks SL1 and SL2 and the surface of the first conductivity-type semiconductor layer 147 of the remaining upper LED cell LC_B, a common electrode layer (or transparent electrode layer) 180 may be formed. In this embodiment, the transparent electrode layer 180 may contact an exposed area CT of the filling metal portion 155', and the filling metal portion 155' may be used as a portion of the common electrode structure. The common electrode structure (combination of transparent electrode layer 180, filling metal portion 155', and one or more additional via electrodes) may be connected to the driving circuit of the circuit board by forming a via electrode in contact with the filling metal portion 155' in the above formation process of the first and second via electrodes 165A and 165B.

Additionally, a transparent resin structure 191 is formed in the first open area O1 for the blue sub-pixel SP1, and a wavelength conversion structure 192 is formed in the second open area O2 for the red sub-pixel SP3 (see FIG. 10H), thereby manufacturing a required display apparatus.

Figure 15A:
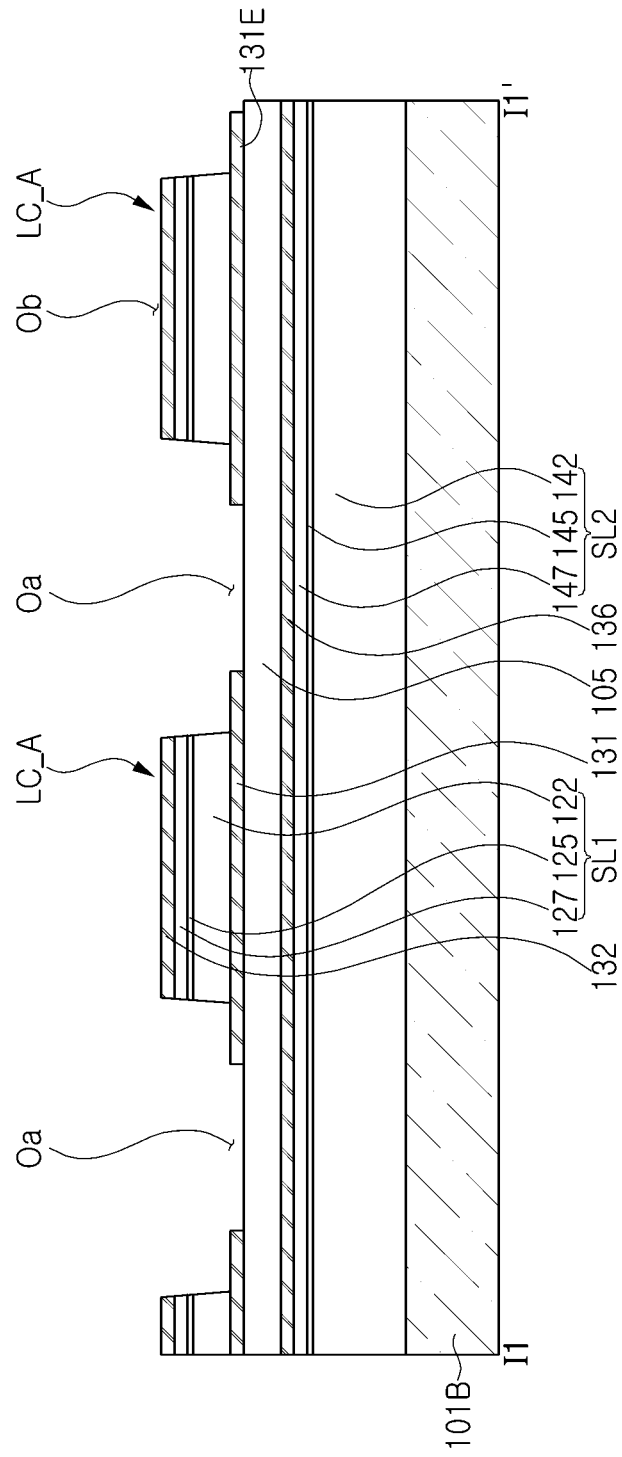
FIGS. 15A to 15H are cross-sectional views illustrating a method of manufacturing an LED display apparatus according to an example embodiment.
Figure 15B:
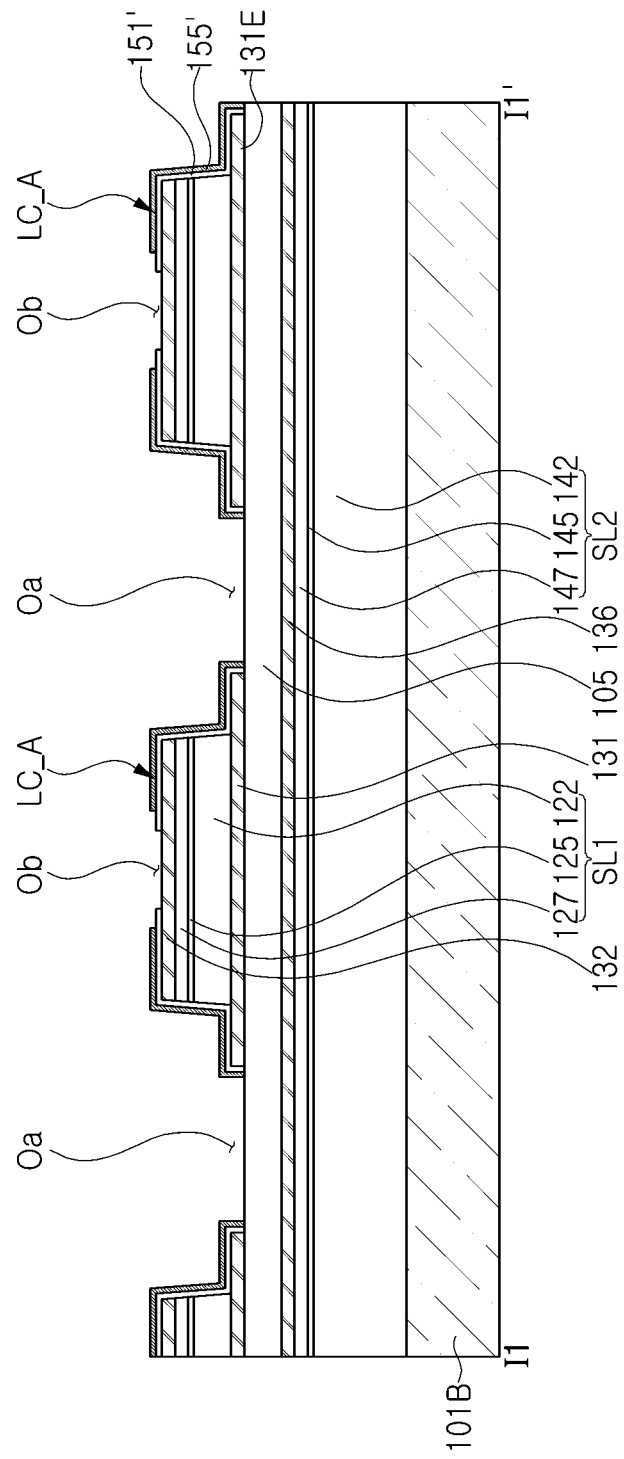
Figure 15C:
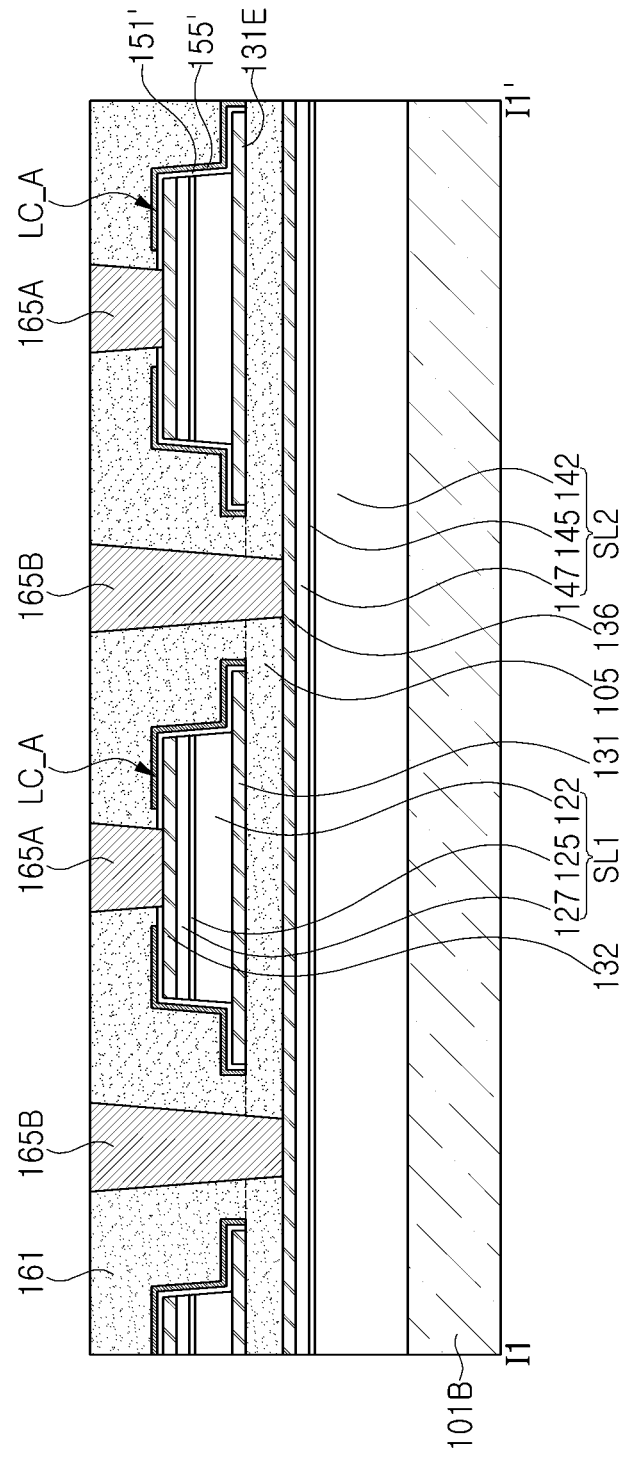
Figure 15D:
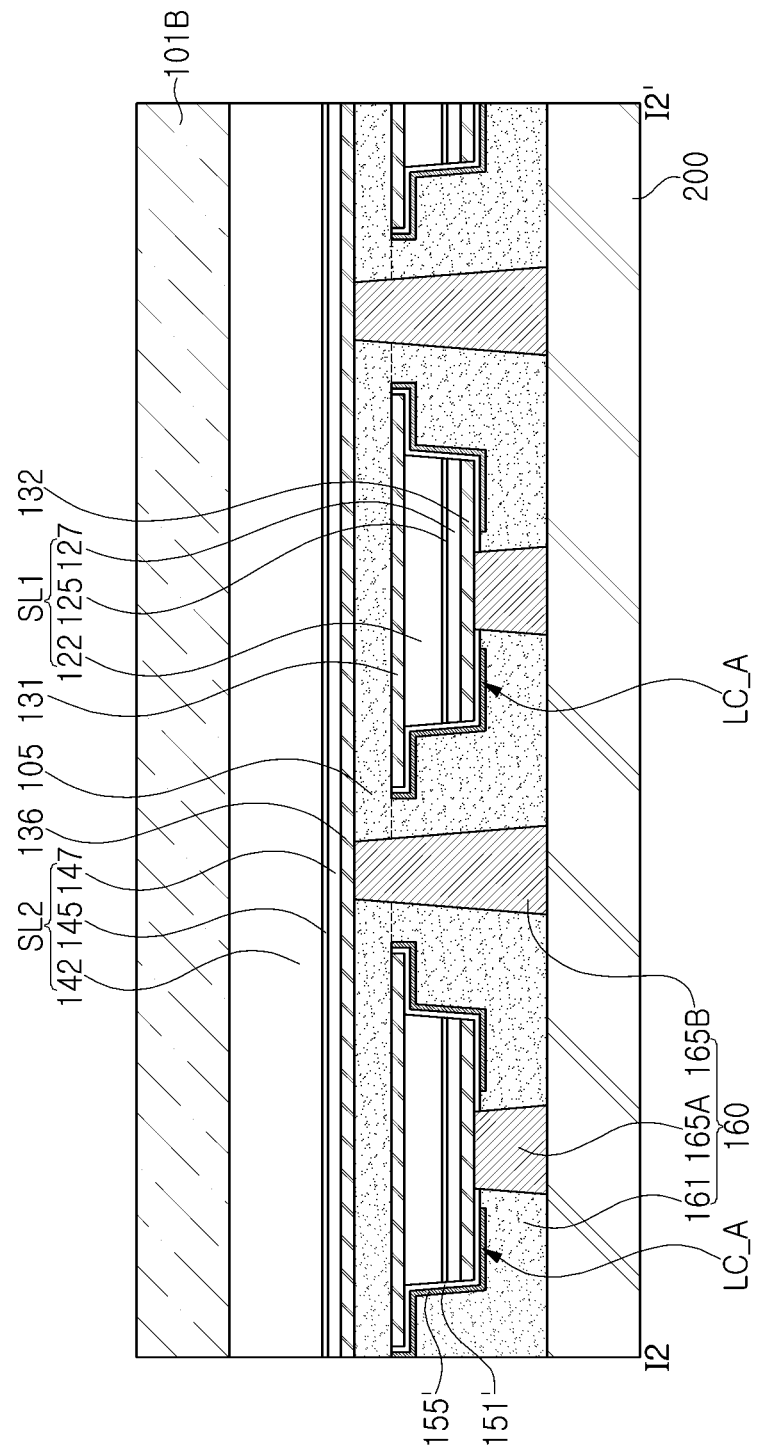
Figure 15E:
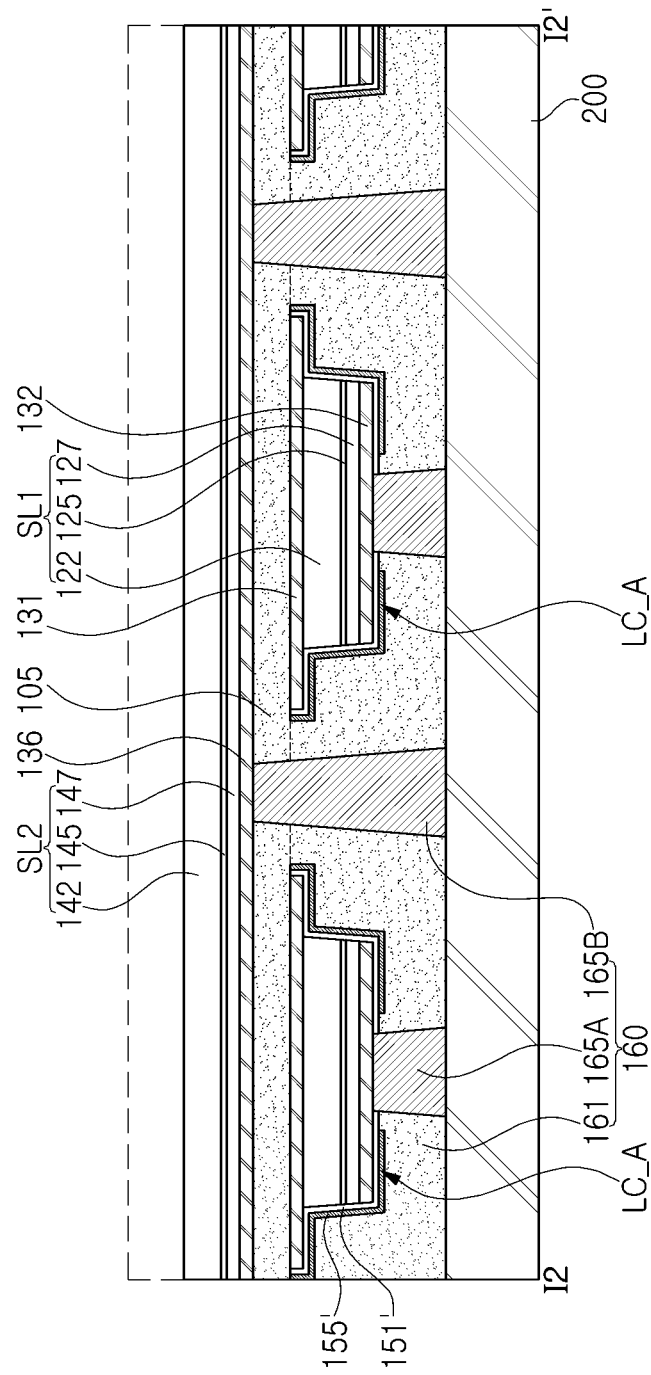
Figure 15F:
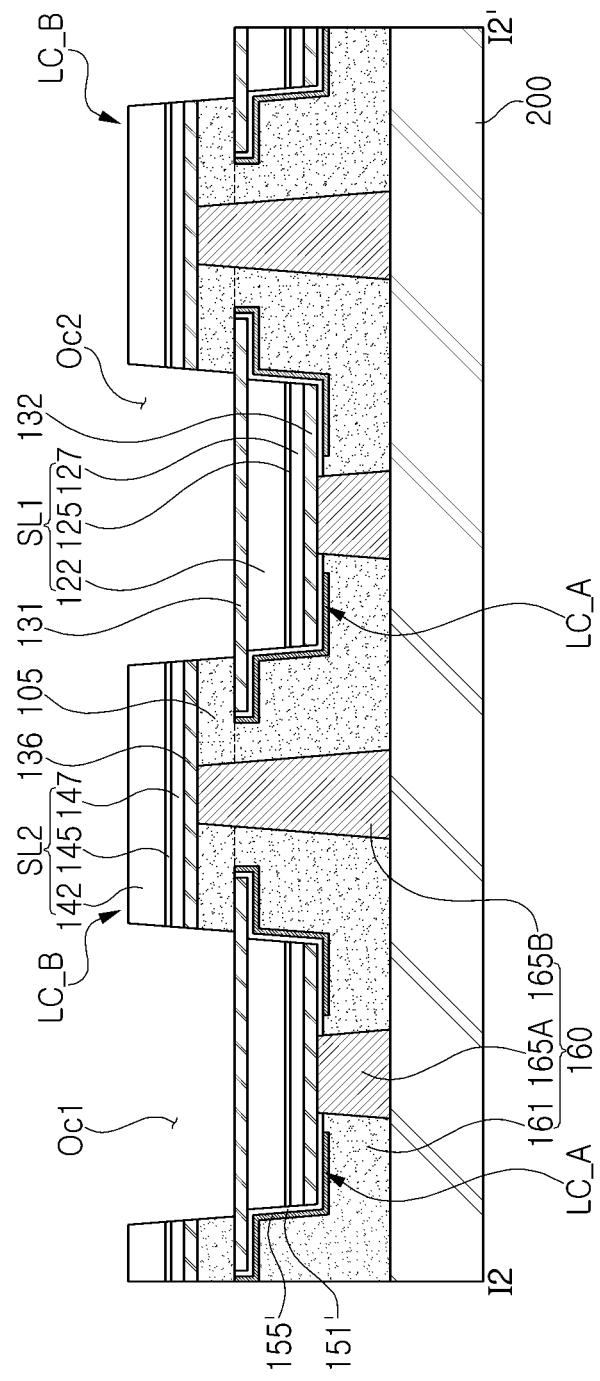
Figure 15G:
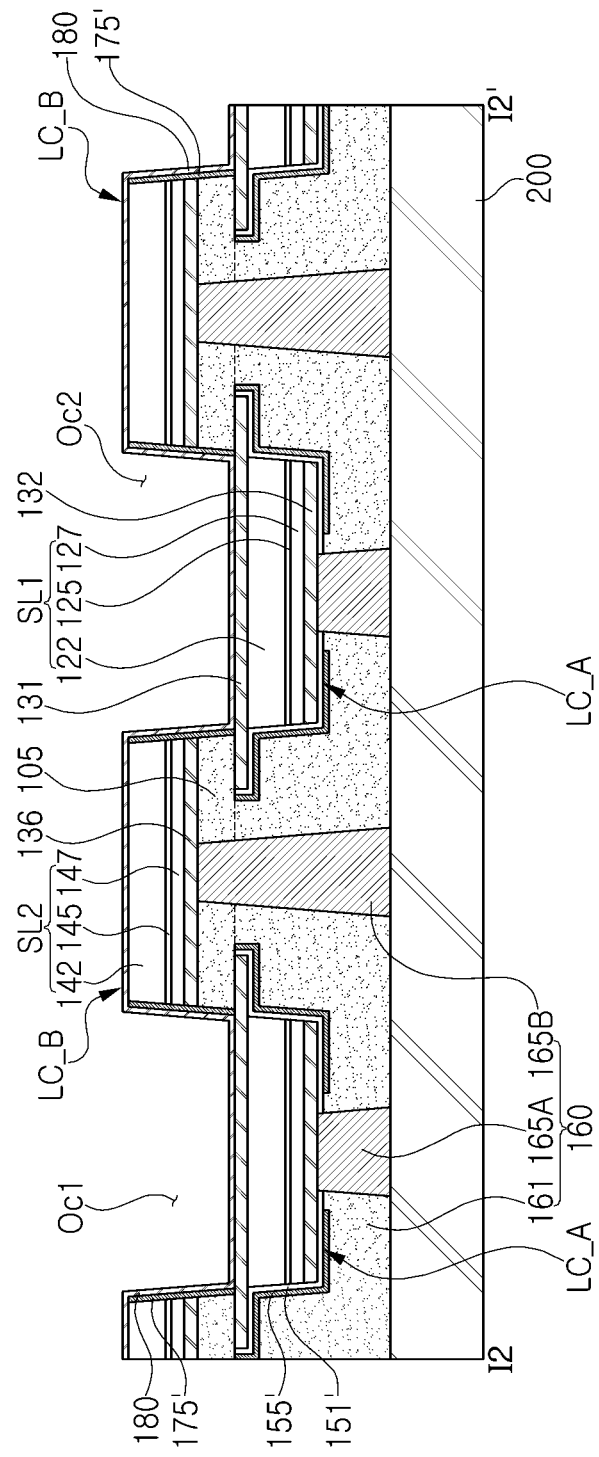
Figure 15H:
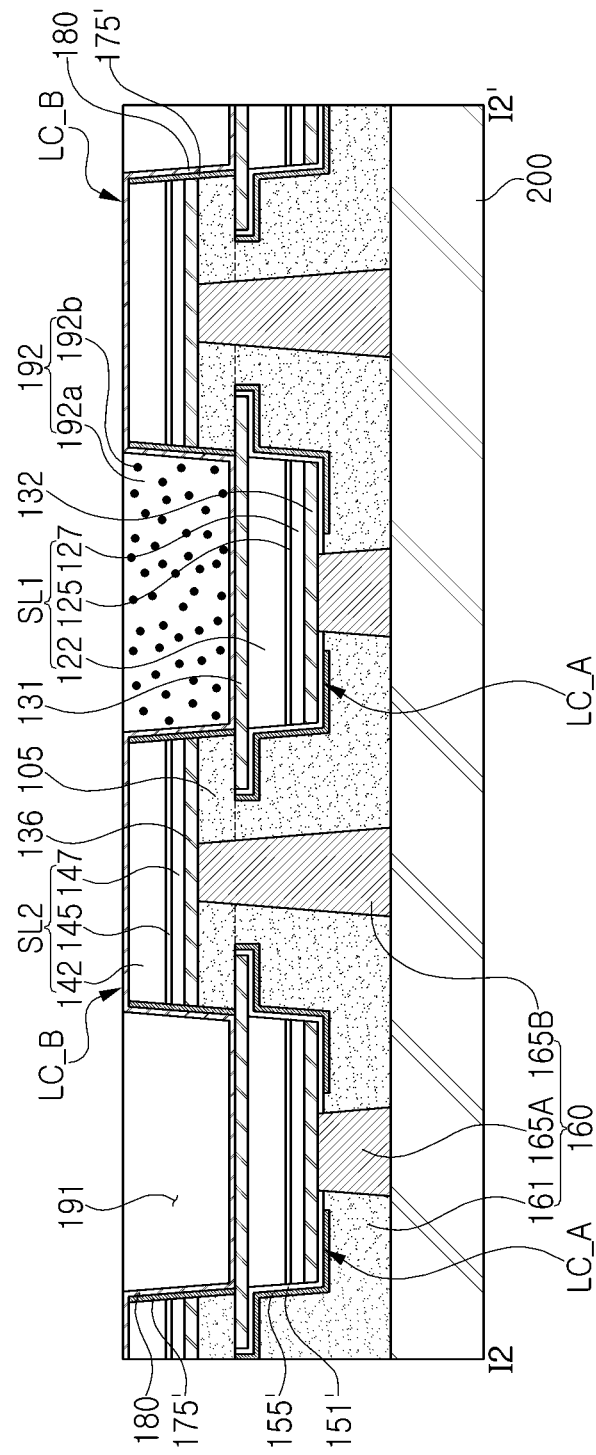
Figure 16A:
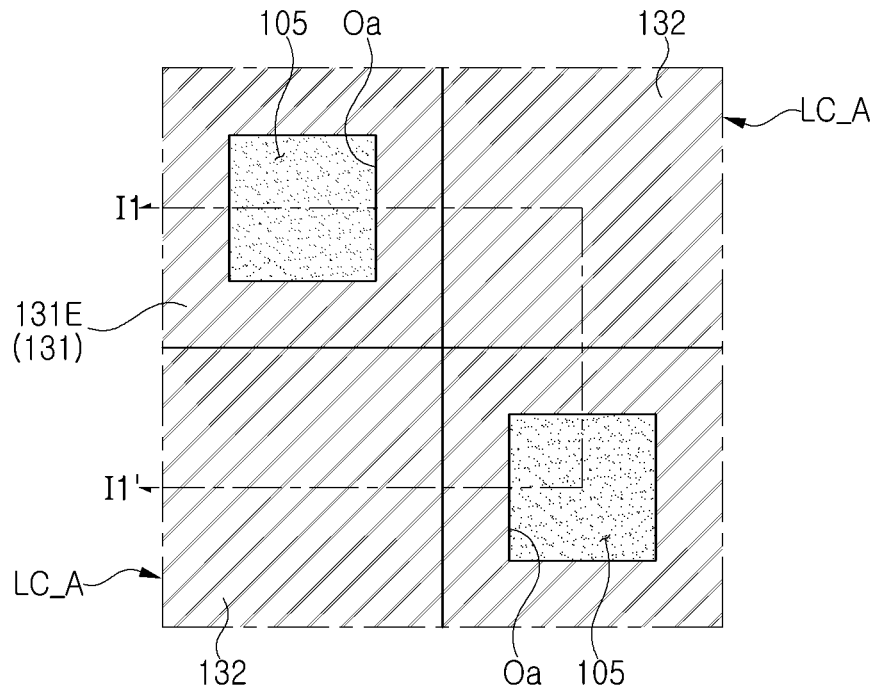
FIGS. 16A and 16B are plan views illustrating a method of manufacturing an LED display apparatus according to an example embodiment.
Figure 16B:
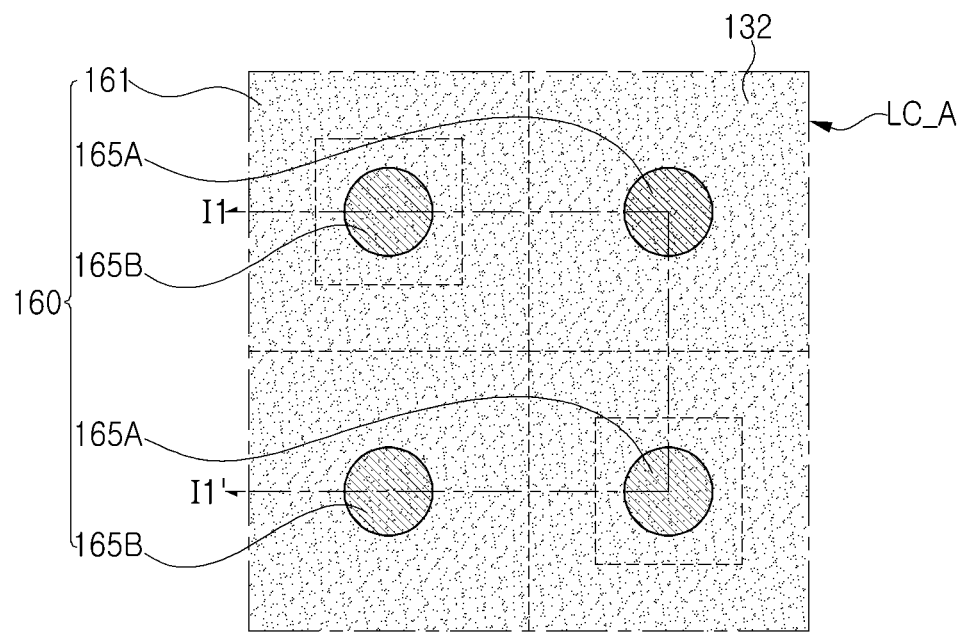

FIGS. 15A to 15H are cross-sectional views illustrating a method of manufacturing an LED display apparatus according to an example embodiment, and FIGS. 16A and 16B are plan views illustrating the manufacturing processes illustrated in FIGS. 15A and 15C, respectively. This manufacturing process may be understood as the manufacturing process of the LED display apparatus 10B illustrated in FIG. 7.

Referring to FIGS. 15A and 16A, the first semiconductor stack SL1 is etched to form a first LED cell LC_A, and the light-transmitting ohmic contact layer 131 of the first semiconductor stack SL1 is partially etched to form a first open area Oa to expose a portion of the inter-cell insulating layer 105. As illustrated in FIG. 16A, the first LED cell LC_A may be provided in an island structure, and the first open area Oa may be provided in a closed structure. In addition, the light-transmitting ohmic contact layer 131 has an extended area 131E that does not overlap with the first LED cell LC_A in a vertical direction in the area larger than the area of the first LED cell LC_A.

Next, referring to FIG. 15B, an insulating film 151' is formed on the surface of the first LED cell LC_A, and a first reflective layer 155' is formed on the insulating film 151'. The first reflective layer 155' may be separated from the first LED cell LC_A and the light-transmitting ohmic contact layer 131 by the insulating film 151'. The insulating film 151' and the first reflective layer 155' may be patterned to form a first open area Oa and a second open area Ob. The second open area Ob may define a contact area of the first LED cell LC_A.

Next, referring to FIGS. 15C and 16B, a wiring insulating layer 161 is formed on the first LED cell LC_A and the inter-cell insulating layer 105, and the first and second via electrodes 165A and 165B may be formed.

The wiring insulating layer 161 may be a low dielectric such as silicon oxide. The first via electrode 165A may be formed to be connected to an ohmic contact layer 132 of the first LED cell LC_A through the second open area Ob. The second via electrode 165B may be formed to penetrate the inter-cell insulating layer 105 in the first open area Oa and to be connected to the ohmic contact layer 136 of the second semiconductor stack SL2. For example, the first and second via electrodes 165A and 165B may include copper or a copper-containing alloy, and may be formed using a dual damascene process.

Next, referring to FIG. 15D, the resultant of FIG. 15C may be bonded to the circuit board 200 in such a manner that the first and second via electrodes 165A and 165B are respectively connected to the driving circuit.

As described above, the circuit board 200 and the resultant (intermediate product of the pixel array) of FIG. 15C may be hybrid bonded. In detail, the wiring insulating layer 161 and the dielectric layer of the circuit board 200 are bonded, and the pad region (e.g., Cu) of the circuit board 200 and the first and second via electrodes 165A and 165B may be bonded respectively.

Next, referring to FIG. 15E, the second growth substrate 101B may be removed from the second semiconductor stack SL2, and the thickness of the second semiconductor stack SL2 may be reduced. Next, referring to FIG. 15F, the second semiconductor stack SL2 may be etched to form an upper LED cell LC_B for a green sub-pixel. In this etching process, open areas Oc1 and Oc2 may be formed in the removed area of the second semiconductor stack SL2, to expose the lower LED cells LC_A corresponding to the blue and red sub-pixel areas.

In this selective removal process, the inter-cell insulating layer 105 may also be removed together with the upper LED cells LC_B in the blue and red sub-pixel areas, to expose the light-transmitting ohmic contact layer 131 of the lower LED cells LC_A.

Then, a common electrode layer (or transparent electrode layer) 180 is formed on the exposed surface of the light-transmitting ohmic contact layer 131 of the first and second semiconductor stacks SL1 and SL2 and the surface of the first conductivity-type semiconductor layer 147 of the remaining upper LED cell LC_B. The first and second open areas O1 and O2 may be located in a level area (or a second level area) corresponding to the remaining upper LED cell LC_B and the inter-cell insulating layer 105.

As described above, the light-transmitting contact layer 131 of the lower LED cells LC_A has the extension portion 131E overlapping the upper LED cell LC_B in a vertical direction, and light leakage may be effectively prevented by the first reflective layer 155' extending to the lower surface of the extension portion 131E of the light-transmitting contact layer 131.

Next, referring to FIG. 15G, before forming the transparent electrode layer 180, a second reflective layer 175' may be introduced to prevent optical interference between the sub-pixels SP1, SP2 and SP3. The second reflective layer 175' may be disposed on side regions of the upper LED cell LC_B and the inter-cell insulating layer 105 adjacent to the open areas Oc1 and Oc2. The second reflective layer 175' may be removed to remain only in the side areas of the upper LED cell LC_B and the inter-cell insulating layer 105, using selective etching or anisotropic etching after forming a conformal reflective metal layer over the entire area, similar to the side reflective layer 175 of the embodiments described above. Then, a common electrode layer (or transparent electrode layer) 180 is formed on the exposed surface of the light-transmitting ohmic contact layer 131 of the first and second semiconductor stacks SL1 and SL2 and the surface of the first conductivity-type semiconductor layer 147 of the remaining upper LED cell LC_B.

Next, referring to FIG. 15H, a transparent resin structure 191 is formed in the first open area O1 for the blue sub-pixel SP1, and a wavelength conversion structure 192 is formed in the second open area O2 for the red sub-pixel SP3, thereby manufacturing the display apparatus illustrated in FIG. 7. In the blue sub-pixel SP1, the blue light B generated from the lower LED cell LC_A is emitted through the transparent resin structure 191 as is, and in the red sub-pixel SP3, the blue light generated from the lower LED cell LC_A may be converted into red light R through the wavelength conversion structure 192 and then emitted. On the other hand, the green sub-pixel SP2 may emit green light from the upper LED cell LC_B.

As set forth above, according to example embodiments, a high-efficiency LED display apparatus that may be manufactured in a simplified process may be provided.

While example embodiments have been illustrated and described above, it will be apparent to those skilled in the art that modifications and variations could be made without departing from the scope of the present inventive concept as defined by the appended claims.

What is claimed is:
1. A display apparatus comprising:
a circuit board including a driving circuit;
a pixel array including a plurality of pixels arranged on the circuit board, each of the plurality of pixels including a plurality of sub-pixels, the plurality of sub-pixels including at least a first sub-pixel, a second sub-pixel and a third sub-pixel, and a light blocking partition disposed between the plurality of sub-pixels,
wherein the first sub-pixel, the second sub-pixel and the third sub-pixel respectively comprise a first lower light emitting diode (LED) cell, a second lower LED cell and a third lower LED cell, each of the first lower LED cell, the second lower LED cell, and the third lower LED cell having a first semiconductor stack configured to generate light of a first wavelength, the first sub-pixel comprises a transparent resin structure disposed on the first lower LED cell, the second sub-pixel comprises an inter-cell insulating layer disposed on the second lower LED cell and an upper LED cell having a second semiconductor stack disposed on the inter-cell insulating layer, the second semiconductor stack being configured to generate light of a second wavelength, and the third sub-pixel comprises a wavelength conversion structure disposed on the third lower LED cell and configured to convert light of the first wavelength into light of a third wavelength.

2. The display apparatus of claim 1, wherein each of the first semiconductor stack and the second semiconductor stack includes a first conductivity-type semiconductor layer, an active layer, and a second conductivity-type semiconductor layer, and the second conductivity-type semiconductor layer is disposed closer to the circuit board than the first conductivity-type semiconductor layer.

3. The display apparatus of claim 2, wherein the pixel array further includes:

a wiring insulating layer disposed between the circuit board and each of the first lower LED cell, the second lower LED cell, and the third lower LED cell, a first electrode penetrating through the wiring insulating layer and electrically connecting to the second conductivity-type semiconductor layer of the first lower LED cell and the driving circuit, a second electrode penetrating through the wiring insulating layer, the second lower LED cell, and the inter-cell insulating layer, and electrically connecting the second conductivity-type semiconductor layer of the upper LED cell and the driving circuit; and a third electrode penetrating through the wiring insulating layer and electrically connecting the second conductivity-type semiconductor layer of the third lower LED cell and the driving circuit, wherein the first electrode, the second electrode, and the third electrode are respectively connected to the first sub-pixel, the second sub-pixel, the third sub-pixel, and wherein a common electrode structure is configured to commonly connect the first sub-pixel, the second sub-pixel, and the third sub-pixel to the driving circuit.

4. The display apparatus of claim 3, wherein each of the first lower LED cell, the second lower LED cell, and the third lower LED cell and the upper LED cell comprises an ohmic contact layer disposed on a lower surface of the second conductivity-type semiconductor layer.

5. The display apparatus of claim 4, wherein the ohmic contact layer of each of the first lower LED cell, the second lower LED cell, and the third lower LED cell comprises a highly reflective metal.

6. The display apparatus of claim 5, wherein each of the first lower LED cell, the second lower LED cell, and the third lower LED cell comprises a light-transmitting contact layer disposed on an upper surface of the first conductivity-type semiconductor layer of the first semiconductor stack.

7. The display apparatus of claim 6, wherein the inter-cell insulating layer is disposed between the light-transmitting contact layer of the second lower LED cell and the highly reflective metal of the upper LED cell.

8. The display apparatus of claim 6, wherein the common electrode structure further comprises:

a transparent electrode layer disposed on the first conductivity-type semiconductor layer of the upper LED cell and extending to the light-transmitting contact layer of each of the first lower LED cell and the third lower LED cell, and a common electrode penetrating through the wiring insulating layer and connecting the transparent electrode layer and the driving circuit.

9. The display apparatus of claim 1, wherein the first lower LED cell, the second lower LED cell, and the third lower LED cell and the upper LED cell each have a side surface inclined downwardly.

10. The display apparatus of claim 1, wherein the light blocking partition extends from lower surfaces of each of the plurality of sub-pixels toward upper surfaces of each of the plurality of sub-pixels, and a width of an upper end of the light blocking partition is less than a width of a lower end of the light blocking partition.

11. The display apparatus of claim 10, wherein the light blocking partition has an insulating film disposed on side surfaces of the plurality of sub-pixels, a reflective metal film disposed on the insulating film, and a filling insulating structure disposed on the reflective metal film.

12. The display apparatus of claim 10, wherein an upper end of the light blocking partition is substantially on a same level as an upper surface of the upper LED cell.

13. The display apparatus of claim 10, wherein an upper end of the light blocking partition is located on a level higher than an active layer of the upper LED cell and lower than an upper surface of the upper LED cell.

14. The display apparatus of claim 13, wherein the pixel array further includes a side reflective layer disposed on a portion of a side surface of the upper LED cell, wherein the side reflective layer is located at a location higher than the upper end of the light blocking partition.

15. A display apparatus comprising:

a circuit board including a driving circuit; and a pixel array including a plurality of pixels arranged on the circuit board, each of the plurality of pixels including a plurality of sub-pixels, the plurality of sub-pixels including a blue sub-pixel, a green sub-pixel and a red sub-pixel, a light blocking partition disposed between the plurality of sub-pixels, and a wiring layer electrically connecting each of the plurality of sub-pixels to the driving circuit respectively, wherein the blue sub-pixel, the green sub-pixel, and the red sub-pixel comprise a first lower LED cell, a second lower LED cell, and a third lower LED cell, respectively, each of the first lower LED cell, the second lower LED cell, and the third lower LED cell having a first semiconductor stack configured to generate blue light, the blue sub-pixel comprises a transparent resin structure disposed on the first lower LED cell, the green sub-pixel comprises an inter-cell insulating layer disposed on the second lower LED cell, and an upper LED cell having a second semiconductor stack disposed on the inter-cell insulating layer, the second semiconductor stack being configured to generate green light, the red sub-pixel comprises a wavelength conversion structure disposed on the third lower LED cell and configured to convert the blue light into red light, and the wiring layer comprises a wiring insulating layer disposed between the circuit board and a pixel light source layer, first to third electrodes penetrating through the wiring insulating layer and respectively connecting each of the plurality of sub-pixels to the driving circuit, and a common electrode connecting each of the plurality of sub-pixels to the driving circuit in common.

16. A display apparatus comprising:
a circuit board including a driving circuit; and
a pixel array including a wiring layer disposed on the circuit board and a pixel light source layer providing a light source for a plurality of pixels, each of the plurality of pixels including a plurality of sub-pixels having a first sub-pixel, a second sub-pixel and a third sub-pixel, the pixel light source layer being divided into a first level area and a second level area disposed on the first level area,
wherein the first level area comprises a lower LED cell in each of the plurality of sub-pixels, and the lower LED cell having a first semiconductor stack configured to generate light of a first wavelength, and
the second level area includes a transparent resin structure disposed on the lower LED cell of the first sub-pixel, an inter-cell insulating layer disposed in the second sub-pixel, an upper LED cell having a second semiconductor stack disposed on the inter-cell insulating layer and configured to generate light of a second wavelength, and a wavelength conversion structure disposed on the lower LED cell of the third sub-pixel and configured to convert light of the first wavelength into light of a third wavelength.

17. The display apparatus of claim 16, wherein the pixel array further includes a first reflective layer disposed on side surfaces and lower surfaces of the lower LED cells, and a second reflective layer disposed on side surfaces of the upper LED cell and the inter-cell insulating layer.

18. The display apparatus of claim 17, wherein each of the first semiconductor stack and the second semiconductor stack includes a first conductivity-type semiconductor layer, an active layer, and a second conductivity-type semiconductor layer,
wherein the second conductivity-type semiconductor layer is disposed closer to the circuit board than the first conductivity-type semiconductor layer.

19. The display apparatus of claim 18, wherein each of the lower LED cells further comprises a highly reflective ohmic contact layer disposed on a lower surface of the second conductivity-type semiconductor layer, and a light-transmitting contact layer disposed on an upper surface of the first conductivity-type semiconductor layer.

20. The display apparatus of claim 19, wherein the light-transmitting contact layer has an extension portion overlapping the upper LED cell in a vertical direction, and the first reflective layer extends to a lower surface of the extension portion of the light-transmitting contact layer.

* * * * *